United States Patent
Park et al.

(10) Patent No.: US 11,784,247 B2
(45) Date of Patent: Oct. 10, 2023

(54) MOS(METAL OXIDE SILICON) CONTROLLED THYRISTOR DEVICE

(71) Applicant: ELECTRONICS AND TELECOMMUNICATIONS RESEARCH INSTITUTE, Daejeon (KR)

(72) Inventors: Kun Sik Park, Daejeon (KR); Jong Il Won, Daejeon (KR); Doo Hyung Cho, Daejeon (KR); Dong Yun Jung, Daejeon (KR); Hyun Gyu Jang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/792,070

(22) PCT Filed: Jun. 10, 2021

(86) PCT No.: PCT/KR2021/007261
§ 371 (c)(1),
(2) Date: Jul. 11, 2022

(87) PCT Pub. No.: WO2021/251764
PCT Pub. Date: Dec. 16, 2021

(65) Prior Publication Data
US 2023/0087416 A1      Mar. 23, 2023

(30) Foreign Application Priority Data

Jun. 10, 2020  (KR) .................. 10-2020-0070547
Jun. 9, 2021   (KR) .................. 10-2021-0074890

(51) Int. Cl.
*H01L 29/745* (2006.01)
*H01L 29/08* (2006.01)
(Continued)

(52) U.S. Cl.
CPC ...... *H01L 29/7455* (2013.01); *H01L 29/0839* (2013.01); *H01L 29/1012* (2013.01); *H01L 29/66378* (2013.01)

(58) Field of Classification Search
CPC ............... H01L 29/083; H01L 29/0834; H01L 29/0839; H01L 29/66378; H01L 29/7455
See application file for complete search history.

(56) References Cited

U.S. PATENT DOCUMENTS 4,646,117 A * 2/1987 Temple ............... H01L 29/7455
                                              257/E29.174
4,782,379 A * 11/1988 Baliga ................ H01L 29/0834
                                              257/E29.037
(Continued)

FOREIGN PATENT DOCUMENTS

JP    H7-183488 A     7/1995
JP    H10-513311 A   12/1998
(Continued)

OTHER PUBLICATIONS

Victor A. K. Temple et al., "MOS-Controlled Thyristors—A New Class of Power Devices," IEEE, 1986.
(Continued)

*Primary Examiner* — Eric A. Ward

(57) ABSTRACT

A MOS controlled thyristor device according to the concept of the present invention includes a substrate comprising a first surface and a second surface, which face each other, gate patterns disposed on the first surface, a cathode electrode configured to cover the gate patterns, and an anode
(Continued)

electrode disposed on the second surface, The substrate includes a lower emitter layer having a first conductive type, a lower base layer having a second conductive type on the lower emitter layer, an upper base region provided in an upper portion of the lower emitter layer and having a first conductive type, wherein the upper base region is configured to expose a portion of a top surface of the lower base layer, an upper emitter region having a second conductive type and provided in an upper portion of the upper base region, a first doped region having a first conductive type and a second doped region surrounded by the first doped region and having a second conductive type, wherein the first and second doped regions are provided in an upper portion of the upper emitter region, and a first doping pattern having a first conductive type, which is provided on one surface of the upper portion of the upper emitter region. The first doping pattern is interposed between the upper base region and the first doped region along a first direction parallel to the top surface of the substrate. The first doping pattern is configured to expose a top surface of the upper emitter region on the other surface of the upper portion of the upper emitter region. Each of the gate patterns is configured to cover portions of an exposed top surface of the lower base layer, an exposed top surface of the upper base layer, an exposed top surface of the upper emitter region, a top surface of the first doping pattern, and a top surface of the first doped region. The cathode electrode is configured to cover portions of top and side surfaces of the gate pattern, a top surface of the second doped region, and a top surface of the first doped region. The first conductive type and the second conductive type are different from each other.

16 Claims, 27 Drawing Sheets

(51) Int. Cl.
*H01L 29/10* (2006.01)
*H01L 29/66* (2006.01)

(56) References Cited

U.S. PATENT DOCUMENTS

| | | | |
|---|---|---|---|
| 4,816,892 A | | 3/1989 | Temple |
| 4,954,869 A | * | 9/1990 | Bauer ................. H01L 29/7455 257/163 |
| 5,260,590 A | | 11/1993 | Temple |
| 5,319,221 A | | 6/1994 | Ueno |
| 5,710,445 A | | 6/1998 | Bauer |
| 6,921,687 B2 | | 7/2005 | Hattori |
| 2011/0233380 A1 | | 9/2011 | Sheu |
| 2015/0076519 A1 | * | 3/2015 | Iwamuro ........... H01L 29/66333 257/77 |
| 2015/0349104 A1 | | 12/2015 | Rodov |
| 2016/0225631 A1 | | 8/2016 | Jun |
| 2020/0076188 A1 | | 3/2020 | Chu |

FOREIGN PATENT DOCUMENTS

| | | |
|---|---|---|
| JP | 3163677 B2 | 5/2001 |
| JP | 4001249 B2 | 10/2007 |
| JP | 4371521 B2 | 11/2009 |
| JP | 2011-055017 A | 3/2011 |

OTHER PUBLICATIONS

S. D. Arthur et al., "Special 1400 Volt N-MCT Designed for Surge Applications," Proc. 5th Eur. Conf. Power Electron. Appl., 1993.
Chen Wan-Jun et al., "High dV/dt immunity MOS controlled thyristor using a double variable lateral doping technique for capacitor discharge applications," Chin. Phys. B, 2014.

* cited by examiner

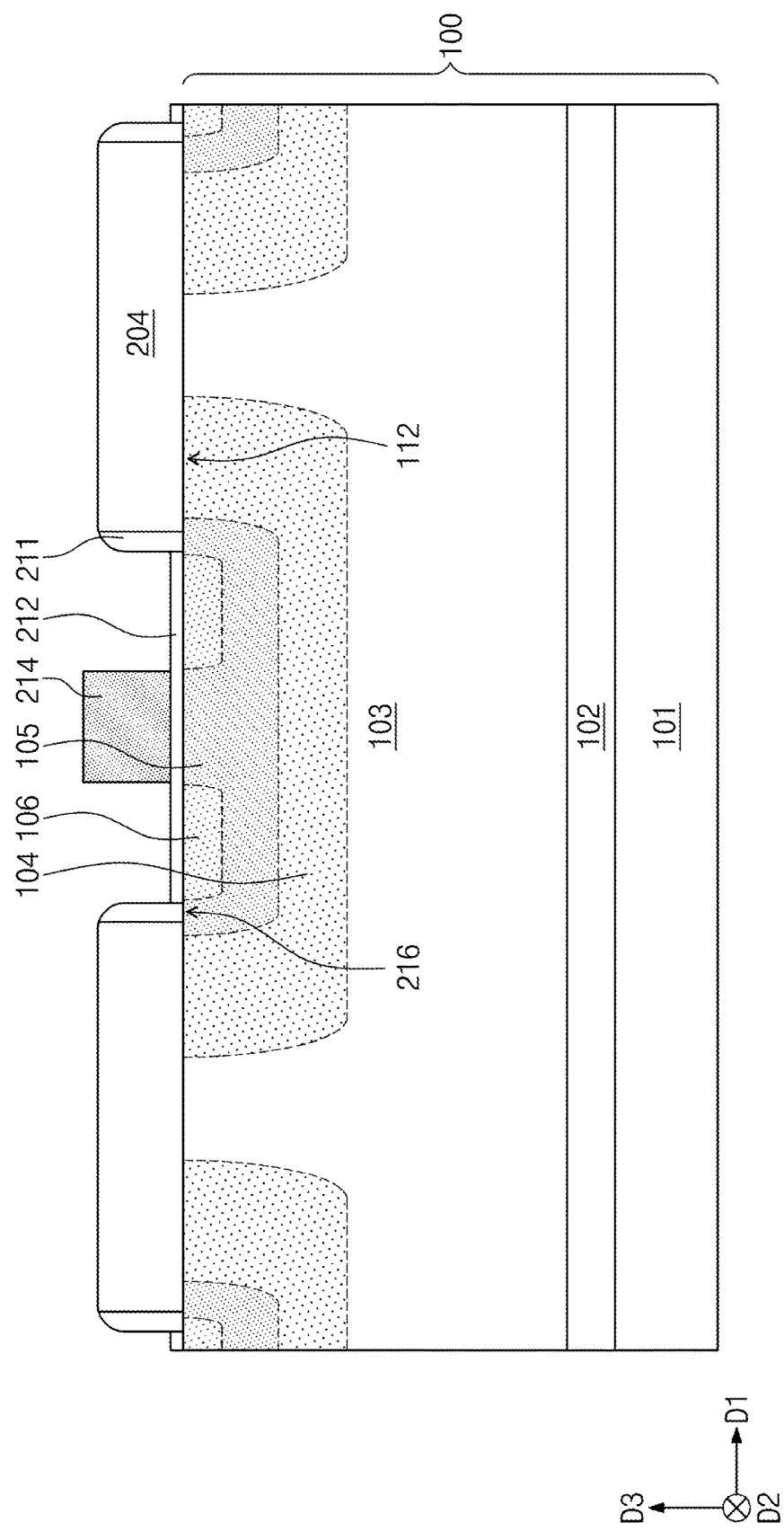

MOS(METAL OXIDE SILICON) CONTROLLED THYRISTOR DEVICE

TECHNICAL FIELD

The present invention relates to a MOS (metal oxide silicon) controlled thyristor device.

BACKGROUND ART

A MOS controlled thyristor (MCT) (hereinafter, referred to as an MCT) is a device that integrates a MOS gate pattern (gate) with a thyristor having a PNPN structure to control turn-on/turn-off of the thyristor through a gate voltage.

The MCT has high current driving capability and low on-state voltage loss characteristics, and since the MCT applies a voltage to a MOS gate to turn on and off the MOS gate, a switching loss is low, and a driving circuit is easily implemented.

DISCLOSURE OF THE INVENTION

Technical Problem

An object of the prevent invention for solving the above problem is to improve the turn-on/turn-off characteristics of the MOS controlled thyristor device, improve uniformity of an operation of the MOS controlled thyristor device, as well as implement a MOS controlled thyristor device that is capable of being turned off at 0 V.

Technical Solution

A MOS controlled thyristor device according to the concept of the present invention includes a substrate (100) including a first surface (100a) and a second surface (100b), which face each other, gate patterns (109) disposed on the first surface (100a), a cathode electrode (114) configured to cover the gate patterns (109), and an anode electrode (115) disposed on the second surface (100b), wherein the substrate (100) includes a lower emitter layer (101) having a first conductive type, a lower base layer (103) having a second conductive type on the lower emitter layer (101), an upper base region (104) provided in an upper portion of the lower emitter layer (101) and having a first conductive type, wherein the upper base region (104) is configured to expose a portion of a top surface of the lower base layer (103), an upper emitter region (105) having a second conductive type and provided in an upper portion of the upper base region (104), a first doped region (106) having a first conductive type and a second doped region (107) surrounded by the first doped region (106) and having a second conductive type, wherein the first and second doped regions (106, 107) are provided in an upper portion of the upper emitter region (105), and a first doping pattern (110) having a first conductive type, which is provided on one surface of the upper portion of the upper emitter region (105), wherein the first doping pattern (110) is interposed between the upper base region (104) and the first doped region (106) along a first direction (D1) parallel to the top surface (100a) of the substrate, the first doping pattern (110) is configured to expose a top surface (111) of the upper emitter region (105) on the other surface of the upper portion of the upper emitter region (105), each of the gate patterns (109) is configured to cover portions of an exposed top surface of the lower base layer (103), an exposed top surface (112) of the upper base layer (104), an exposed top surface (111) of the upper emitter region (105), a top surface of the first doping pattern (110), and a top surface of the first doped region (106), the cathode electrode (114) is configured to cover portions of top and side surfaces of the gate pattern (109), a top surface of the second doped region (107), and a top surface of the first doped region (106), and the first conductive type and the second conductive type are different from each other.

In some embodiments, the first doping pattern (110) may have a segmented ring or line shape, the top surface (111) of the top upper emitter region (105) may be exposed by the segmented portion, and an area of the top surface of the first doping pattern (110) may be greater than that of a portion of the top surface (111) of the upper emitter region.

In some embodiments, the first doping pattern may be disposed adjacent to one surface of the upper emitter region (105), and the MOS controlled thyristor device may further include a second doping pattern having a second conductive type and disposed on the exposed top surface (111) of the upper emitter region (105).

In some embodiments, the first doping pattern may have a segmented ring or segmented line shape, the second doping pattern (116) may be disposed on the segmented portion, and an area of the top surface of the first doping pattern may be greater than that of a top surface of the second doping pattern (116).

In some embodiments, the MOS controlled thyristor device may further include a threshold voltage control layer (117) having a first conductive type and provided in at least a portion of the upper portion of the upper base region (104), wherein the threshold voltage control layer (117) may be in contact with the first doping pattern (110).

In some embodiments, the threshold voltage control layer (117) may be disposed over the entire first surface (100a) of the substrate (100), and a doping concentration of each of the first doped region (106) and the second doped region (107) may be higher than that of the threshold voltage control layer (117).

In some embodiments, the first doping pattern (110) may be disposed adjacent to one surface of the upper emitter region (105), the MOS controlled thyristor device may further include a second doping pattern (116) having a second conductive type and disposed on the other surface of the upper emitter region (105), and the threshold voltage control layer (117) may be in contact with the first doping pattern (110) and the second doping pattern (116).

In some embodiments, the threshold voltage control layer (117) may be disposed over the entire first surface (100a) of the substrate (100), and a doping concentration of each of the first doped region (106), the second doped region (107), and the second doping pattern (116) may be higher than that of the threshold voltage control layer (117).

In some embodiments, the upper emitter region (105) may be provided in plurality, the upper emitting regions (105) may be spaced apart from each other along the first direction (D1), each of the upper emitter regions (105) may be parallel to the first surface (100a) of the substrate (100) and extends along a second direction (D2) crossing the first direction (D1), and the first doped region (106) is provided in a pair within the upper emitter region (105), the pair of first doped regions (106) may be spaced apart from each other with the second doped region (107) therebetween, each of the first doped regions (106) and the second doped region (107) may extend in a line shape along the second direction (D2), and the exposed top surface (111) of the upper emitter region (105) and the first doping pattern (110) may be spaced apart from each other with the pair of doped regions (106) and the second doped region (107) therebetween in the first direction In some embodiments, the first doping pattern (110) may have a segmented line shape, the top surface (111) of the upper emitter region (105) is exposed at the segmented portion.

In some embodiments, the first doping pattern (111) may have a segmented line shape, and the MOS controlled thyristor device may further include a second doping pattern (116) provided at the segmented portion.

In some embodiments, the upper emitter region (105) may be provided in plurality, and in view of planarity, the upper emitter regions (105) may be arranged to be spaced apart from each other along the first direction (D1) and a second direction (D2), wherein the second direction (D2) may be parallel to the first surface (100a) of the substrate (100) and cross the first direction (D1), the second doped region (107) may have a circular shape, the first doped region (106) has a ring shape, and the first doping pattern (110) may have a segmented ring shape that surrounds the first doped region (106).

In some embodiments, each of the first doping pattern (110) and the exposed top surface (111) of the upper emitter region (105) may be spaced apart from the exposed top surface of the lower base layer (103) with the exposed top surface (112) of the upper base region (104) therebetween.

In some embodiments, the upper emitter region (105) may be provided in plurality, and in view of planarity, the upper emitter regions (105) may be arranged to be spaced apart from each other along the first direction (D1) and a second direction (D2), wherein the second direction (D2) may be parallel to the first surface (100a) of the substrate and cross the first direction (D1), the second doped region (107) may have an octagonal shape, the first doped region (106) may have an octagonal ring shape, the first doping pattern (110) may have a segmented ring shape that surrounds the first doped region (106), and the top surface (111) of the upper emitter region (105) may be exposed through the segmented portion of the first doping pattern (110).

In some embodiments, the segmented portion of the first doping pattern (110) may be disposed at a corner portion of the octagonal ring.

In some embodiments, in view of planarity, the exposed top surface of the lower base layer (103) may be provided in plurality, the exposed top surfaces of the lower base layer (103) may be provided in plural circular shapes spaced apart from each other, the exposed top surfaces of the lower base regions (103) may be arranged to be spaced apart from each other along the first direction (D1) and a second direction (D2), wherein the second direction (D2) may be parallel to the first surface (100a) of the substrate (100) and cross the first direction (D1), the top surface (112) of the upper base region (104) may have a ring shape that surrounds the exposed top surface of each of the lower base regions (103), the first doping pattern (110) may have a segmented ring shape that surrounds the top surface (112) of the upper base region (104), and the first doping pattern (106) may be configured to surround the first doping pattern (110).

Advantageous Effects

The MOS controlled thyristor device according to the present invention may include the doping pattern having the conductive type different from that of the upper emitter region in one portion of the off-FET channel region (simultaneously, the flow path of the source current for the on-FET) of the unit cell and additionally include the doping pattern having the conductive type that is the same as that of the upper emitter region in the other (remaining) portion of the off-FET channel region. The off-FET may be turned on at the gate voltage of 0 V to turn off the MOS controlled thyristor device, and the on-FET may be turned on at the predetermined gate voltage to turn on the MOS controlled thyristor device. As a result, the turn-on/turn-off characteristics of the MOS controlled thyristor device may be improved, and the gate driving circuit may be easily designed.

Since all unit cells of the MOS controlled thyristor device according to the present invention include both the on-FET and the off-FET, the uniformity of the operation of the MOS controlled thyristor device may be improved.

BRIEF DESCRIPTION OF THE DRAWINGS

FIG. 1B is a cross-sectional view taken along line I-I' of FIG. 1a.

FIG. 2b is a cross-sectional view taken along line II-II' of FIG. 2a.

FIG. 3b is a cross-sectional view taken along line of FIG. 3a.

FIG. 4b is a cross-sectional view taken along line IV-IV' of FIG. 4a.

FIGS. 7a to 7h are cross-sectional views illustrating a method for manufacturing a MOS controlled thyristor device according to some embodiments.

MODE FOR CARRYING OUT THE INVENTION

Embodiments of the present invention will be described with reference to the accompanying drawings so as to sufficiently understand constitutions and effects of the present invention. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. In the accompanying drawings, the components are shown enlarged for the sake of convenience of explanation, and the proportions of the components may be exaggerated or reduced for clarity of illustration.

Unless terms used in embodiments of the present invention are differently defined, the terms may be construed as meanings that are commonly known to a person skilled in the art. Hereinafter, the present disclosure will be described in detail by explaining preferred embodiments of the invention with reference to the accompanying drawings.

Embodiment 1-1

Figure 1A:
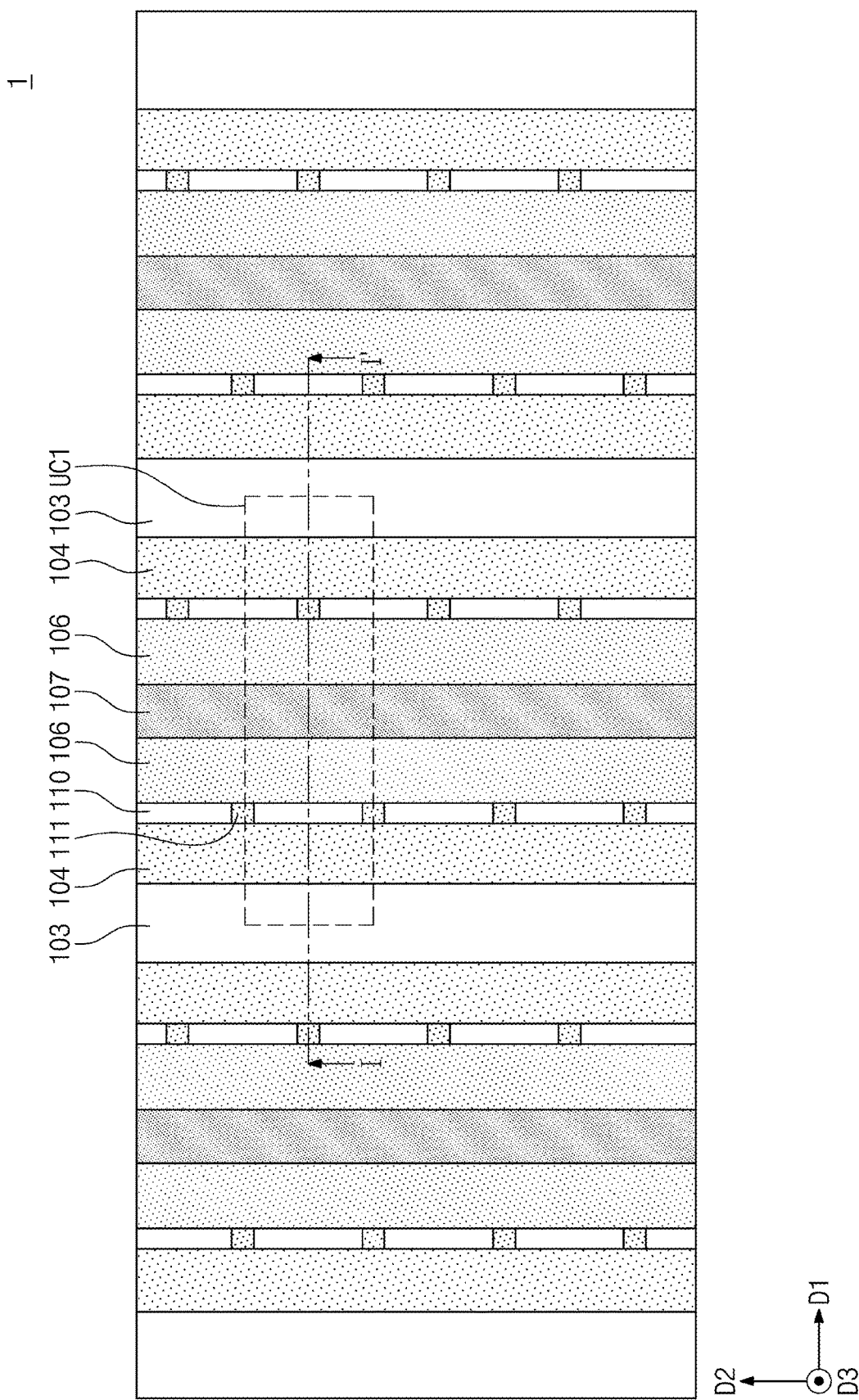
FIG. 1a is a plan view of a MOS controlled thyristor device according to an embodiment of the present invention.
Figure 1B:
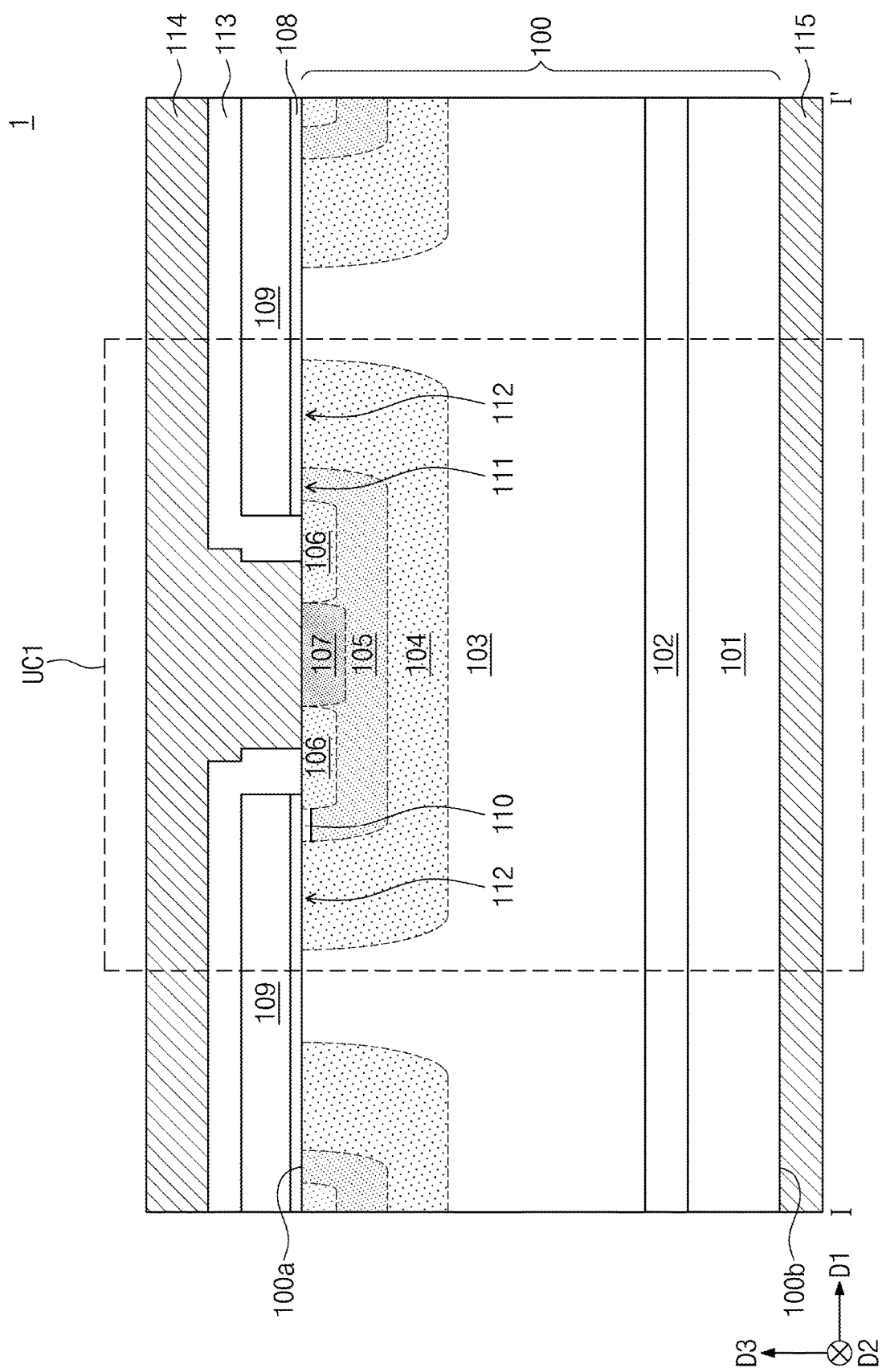

FIG. 1a is a plan view of a MOS controlled thyristor device according to an embodiment of the present invention. FIG. 1B is a cross-sectional view taken along line I-I' of FIG. 1a. In order to show the configuration more clearly, some components of FIG. 1b are omitted in FIG. 1a.

Referring to FIGS. 1a and 1b, in a MOS controlled thyristor device 1 according to an embodiment, a plurality of patterned first unit cells UC1 may be disposed to be aligned. A substrate 100 including a first surface 100a and a second surface 100b facing the first surface 100a may be provided. Hereinafter, a first direction D1 refers to a direction parallel to the first surface 100a of the substrate 100. A second direction D2 refers to a direction parallel to the first surface 100a of the substrate 100 and perpendicular to the first direction D1. A third direction D3 refers to a direction perpendicular to the first surface 100a of the substrate 100.

The substrate 100 may include a lower emitter layer 101, a buffer layer 102, and a lower base layer 103, which are sequentially laminated. Each of the lower emitter layer 101, the buffer layer 102, and the lower base layer 103 may be a semiconductor layer. Each of the lower emitter layer 101, the buffer layer 102, and the lower base layer 103 may be, for example, a silicon layer.

The lower emitter layer 101 may have a strongly doped first conductive type. For example, the lower emitter layer 101 may have a p+ type and may have a doping concentration higher than that of the upper base region 104, which will be described later. For example, the lower emitter layer 101 may have a doping concentration of 5×1018 cm-3 or more of p-type impurities (B, Al, etc.).

The buffer layer 102 may have a second conductive type. The buffer layer 102 may be an n+ type. The lower base layer 103 may have a lightly doped second conductive type. For example, the lower base layer 103 may have an n--type and may have a doping concentration lower than that of an upper emitter region 105 and a second doped region 107, which will be described later. For example, the buffer layer 102 may have a doping concentration of $1\times10^{16}$ cm-3 to $1\times10^{18}$ cm-3 of n-type impurities (P, As, etc.), and the lower base layer 103 may have a doping concentration of $1\times10^{12}$ cm$^{-3}$ to $1\times10^{15}$ cm$^{-3}$ of n-type impurities (P, As, etc.). The buffer layer 102 may have a thickness of, for example, 1 μm to 10 μm, and the lower base layer 103 may have a thickness of 10 μm to 2,000 μm.

Upper base regions 104 may be disposed on the lower base layer 103. Each of the upper base regions 104 may have a first conductive type. Each of the upper base regions 104 may have a p-type. The upper base regions 104 may be spaced apart from each other along the first direction D1, and each of the upper base regions 104 may extend along the second direction D2. The upper base region 104 may be formed to be spaced apart from a bottom surface of the lower base layer 103 in the third direction D3. The upper base region 104 may be formed adjacent to the first surface 100a of the substrate 100.

The upper base regions 104 may expose top surfaces of the lower base layer 103. The top surfaces of the lower base layer 103, which are exposed from the upper base regions 104, may be spaced apart from each other along the first direction D1, and each of the top surfaces may extend along the second direction D2.

The upper emitter region 105 may be disposed in an upper portion of each of the upper base regions 104. The upper emitter region 105 may have a second conductive type. The upper emitter region 105 may have an n-type. The upper emitter region 105 may extend along the second direction D2. The upper emitter region 105 may be formed to be spaced apart from a bottom surface of the upper base region 104 in the third direction D3.

A pair of first doped regions 106 may be disposed on an upper portion of the upper emitter region 105. The first doped regions 106 may be spaced apart from each other in the first direction D1. Each of the first doped regions 106 may have a first conductive type. For example, the first doped region 106 may have a p+ type. A second doped region 107 may be disposed between the first doped regions 106. The second doped region 107 may have a second conductive type. For example, the second doped region 107 may have an n+ type. The first doped regions 106 and the second doped region 107 may be disposed in an upper portion of the upper base region 104. The first doped regions 106 and the second doped region 107 may extend along the second direction D2. The first doped region 106 and the second doped region 107 may be formed to be spaced apart from the bottom surface of the upper emitter region 105 in the third direction D3.

A doping pattern 110 may be disposed adjacent to the first doped regions 106 in the upper emitter region 105. The doping pattern 110 may have a first conductive type. The doping pattern may have, for example, a p-type. In a view of planarity, the doping pattern 110 may have a segmented line shape along the second direction D2. That is, the doping pattern 110 may have a shape in which a plurality of bars are arranged. The segmented portion of the doping pattern 110 may expose top surfaces 111 of the upper emitter region 105 along the second direction D2. The exposed top surfaces 111 of the upper emitter region 105 may be spaced apart from each other in the second direction D2. The sum of areas of the exposed top surfaces 111 of the upper emitter region 105 may be less than the sum of areas of the top surfaces of the doping pattern 110.

A gate insulating layer 108 and a gate pattern 109 may be sequentially provided on the first surface 100a of the substrate 100. The gate insulating layer 108 and the gate pattern 109 may cover portions of the exposed top surface of the lower base layer 103, the top surface 112 of the upper base region 104, the top surface 111 of the upper emitter region 105, the doping pattern 110, and the top surface of the first doped region 106. The gate pattern 109 may include polysilicon doped with impurities.

An interlayer insulating layer 113 may be provided on top and side surfaces of the gate pattern 109 and on a top surface of the gate insulating layer 108. A cathode electrode 114 may be provided on the first surface 100a of the substrate 100, on which the interlayer insulating layer 113 is not covered, and the interlayer insulating layer 113. An anode electrode 115 may be provided on the second surface 100b of the substrate 100. Each of the cathode electrode 114 and the anode electrode 115 may include a metal material.

According to the concept of the present invention, the MOS controlled thyristor device 1 controls turn-on and turn-off of on-FET and off-FET MOS gates. Specifically, the lower emitter layer 101, the lower base layer 103, the upper base region 104, and the upper emitter region 105 form a PNPN junction.

In the on-FET structure, a portion of the top surface 111 of the upper emitter region 105 serves as a path of source or source current. The portion of the top surface 111 of the upper emitter region 105 may be a region exposed from the doping pattern 110. In the on-FET, a portion of the top surface 112 of the upper base region 104 serves as a channel. The portion of the top surface 112 of the upper base region 104 is also referred to as a first channel 112. The portion of the top surface 112 of the upper base region 104 may be a portion exposed from the upper emitter region 105. The exposed portion of the top surface of the lower base layer 103 serves as a drain.

In the off-FET structure, the top surface portion 112 of the upper base region 104 serves as a source, the doping pattern 110 serves as a channel, and the first doped region 106 serves as a drain. The doping pattern 110 is also referred to as a second channel 110. In the on-FET and off-FET, the gate pattern 109 serves as a gate.

The turn-on of the first unit cell UC1 refers to the turn-on of the on-FET. When the first unit cell UC1 is turned on, if a voltage equal to or greater than a threshold voltage of the on-FET is applied to the gate pattern 109, the first channel 112 is turned on. Here, since the top surface portion 111 of the upper emitter region 105 has a smooth current flow of the on-FET, carriers (electrons) may be injected into the lower base layer 103 to turn on lower bipolar junction transistors (PNP BJTs) 101, 103, and 104. When lower PNP NJTs 101, 103, and 104 are turned on, holes may be injected from the lower emitter layer 101 to the upper base region 104. As a result, upper NPN BJT 103, 104, and 105 may be turned on. The first unit cell UC1 of the MOS controlled thyristor device may be turned on by a regenerative action in which electrons are injected from the second doped region 107 and the upper emitter region 105 into the lower base layer 103 of the lower PNP BJTs 101, 103, and 104 due to the turn-on of the upper NPN BJTs 103, 104, and 105.

The turn-off of the first unit cell UC1 refers to the turn-on of the off-FET. When the first unit cell UC1 is turned off, the doping pattern 110 may form an off-FET channel of a depletion mode, and thus, the off-FET may be turned on at a gate voltage of 0 V. The top surface portion 111 of the upper emitter region 105 may serve as an off-FET channel in an inversion mode, and thus, the off-FET may be turned on only under a negative gate voltage.

When the voltage of 0 V is applied to the gate pattern 109, the second channel 110 is turned on, and the holes in the upper base region 104 move to the first doped region 106 that is the drain and then is removed, as the off-FET is turned on. Potential barriers of the upper NPN BJTs 103, 104, and 105 increase, and thus, the injection of the electrons from the upper emitter region 105 may be stopped, the NPN BJTs 103, 104, and 105 may be turned off, and the regenerative action of the MOS controlled thyristor device may be stopped.

That is, in the turn-on process of the on-FET, current may flow smoothly in the region of the first channel 112 and the top surface portion 111 of the upper emitter region 105 at a predetermined voltage, and, in the turn-on process of the off-FET, the channel function may be smooth in the doping pattern 110 at the voltage of 0 V.

Since the doping pattern 110 having a conductive type different from that of the upper emitter region 105 is formed in the upper portion of the upper emitter region 105, the MOS controlled thyristor device may be turned off at the gate voltage of 0 V. Since a portion of the upper emitter region 105 (a portion of the top surface 111 of the upper emitter region 105) is exposed from the doping pattern 110, the current flow of the on-FET may be smooth. Also, a concentration of the upper base region 104 may be adjusted to adjust a threshold voltage of the on-FET. The MOS controlled thyristor device according to the present invention may be turned off at the gate voltage of 0 V and may be turned on at a predetermined gate voltage. In addition, the turn-on gate voltage of the MOS controlled thyristor device may stably increase to several V or more.

The structures of the doping pattern 110 having different conductive types and the top surface 111 of the upper emitter region 105 exposed from the doping pattern 110 may be repeated as illustrated in FIG. 1a. Thus, the channel of the off-FET and the path of the current flow of the on-FET may be uniformly disposed in the MOS controlled thyristor device. As a result, the turn-on and turn-off characteristics of the MCT device may be uniform in all the cells.

As described above, since the exposed area of the doping pattern 110 is larger than the exposed area 111 of the top surface portion of the upper emitter area 105, the turn-off performance may be improved.

Embodiment 1-2

Figure 2A:
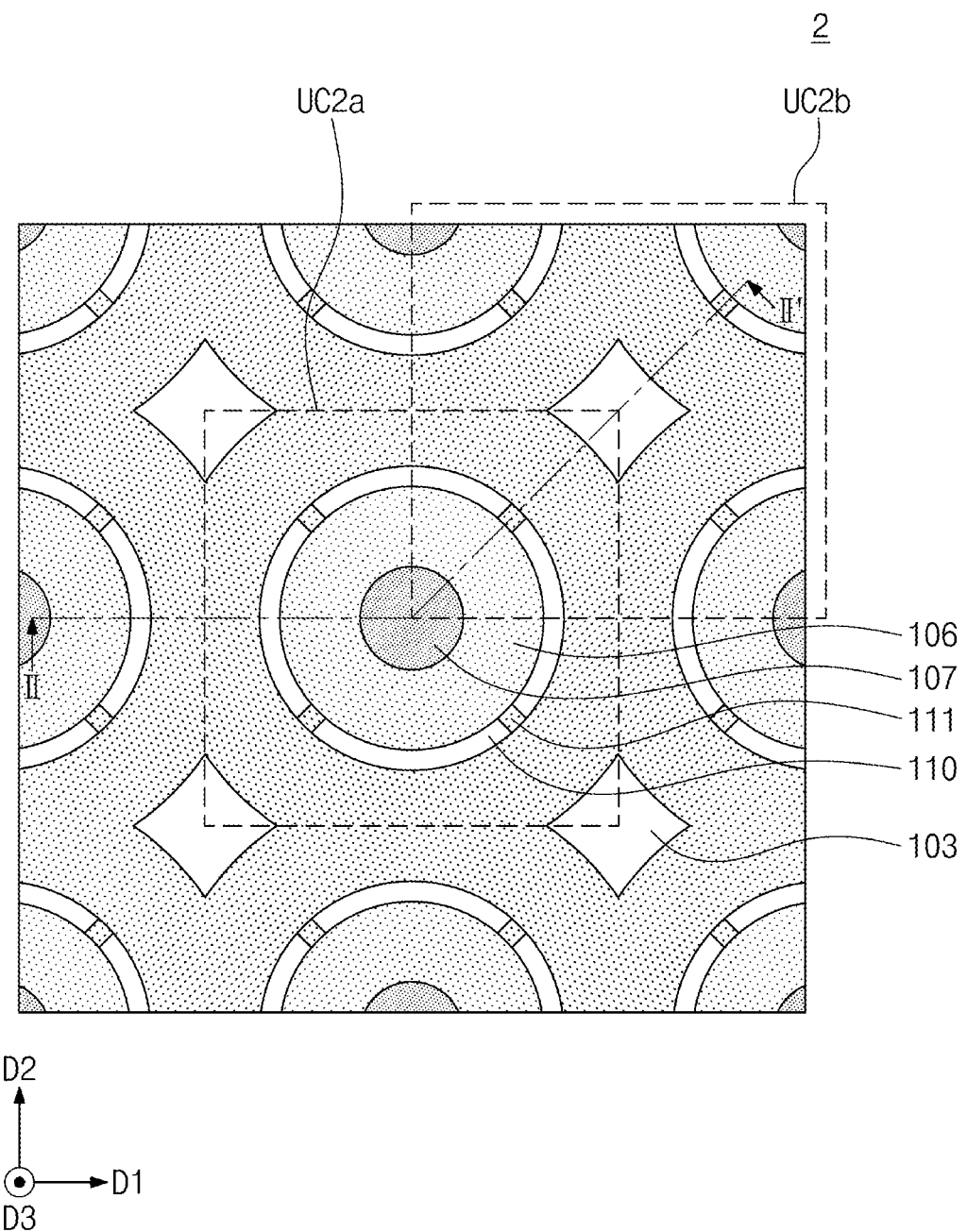
FIG. 2a is a plan view of a MOS controlled thyristor device according to some embodiments of the present invention.
Figure 2B:
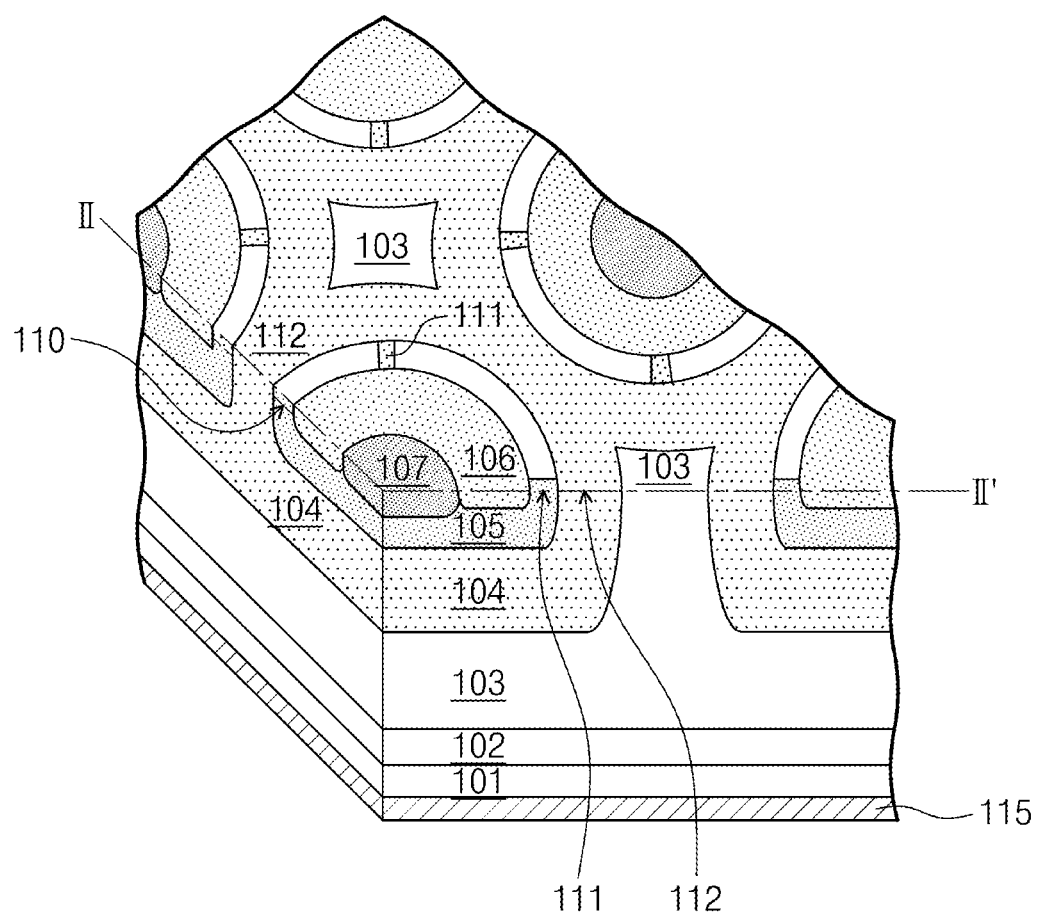

FIG. 2a is a plan view of a MOS controlled thyristor device according to some embodiments of the present invention. FIG. 2b is a cross-sectional view taken along line II-IF of FIG. 2a. In order to show the components more clearly, some components of FIG. 2b are omitted in FIG. 2a. Since the above-described contents have been described in FIGS. 1a and 1c except for following contents to be described below, the duplicated contents will be omitted.

Referring to FIGS. 2a and 2b, a MOS controlled thyristor device 2 according to some embodiments may include a plurality of second unit cells UC2a or UC2b. The second unit cells UC2a or UC2b may have a structure repeated along the first direction D1 and the second direction D2. The second unit cells UC2a or UC2b may be arranged along the first direction D1 and the second direction D2.

In view of planarity, a first doped region 106 may have a ring shape. A doping pattern 110 may have a segmented ring shape. A second doped region 107 may have a circular shape. The first doped region 106 may surround the second doped region 107. The doping pattern 110 may surround the first doped region 106.

The segmented portion of the doping pattern 110 may expose top surfaces 111 of the upper emitter region 105. The exposed top surface 111 of the upper emitter region 105 may be disposed adjacent to an exposed top surface of a lower base layer 103. The exposed top surface 111 of the upper emitter region 105 may be spaced apart from the exposed top surface of the lower base layer 103 with an exposed top surface 112 of an upper base region 104 therebetween. The exposed top surface of the lower base layer 103 may have a shape similar to a quadrangle, and each side thereof may be concave.

As illustrated in FIGS. 1a and 1b, the doping pattern 110 may serve as a channel for an off-FET, and a portion of the exposed top surface 112 of the upper base region 104 may serve as a channel for an on-FET. A portion of the exposed top surface 111 of the upper emitter region 105 may serve as a flow path of source current for the on-FET. According to the concept of the present invention, since the doping pattern 110 has a uniform shape like the ring, uniform characteristics of the off-FET and on-FET may be implemented.

Embodiment 1-3

Figure 3A:
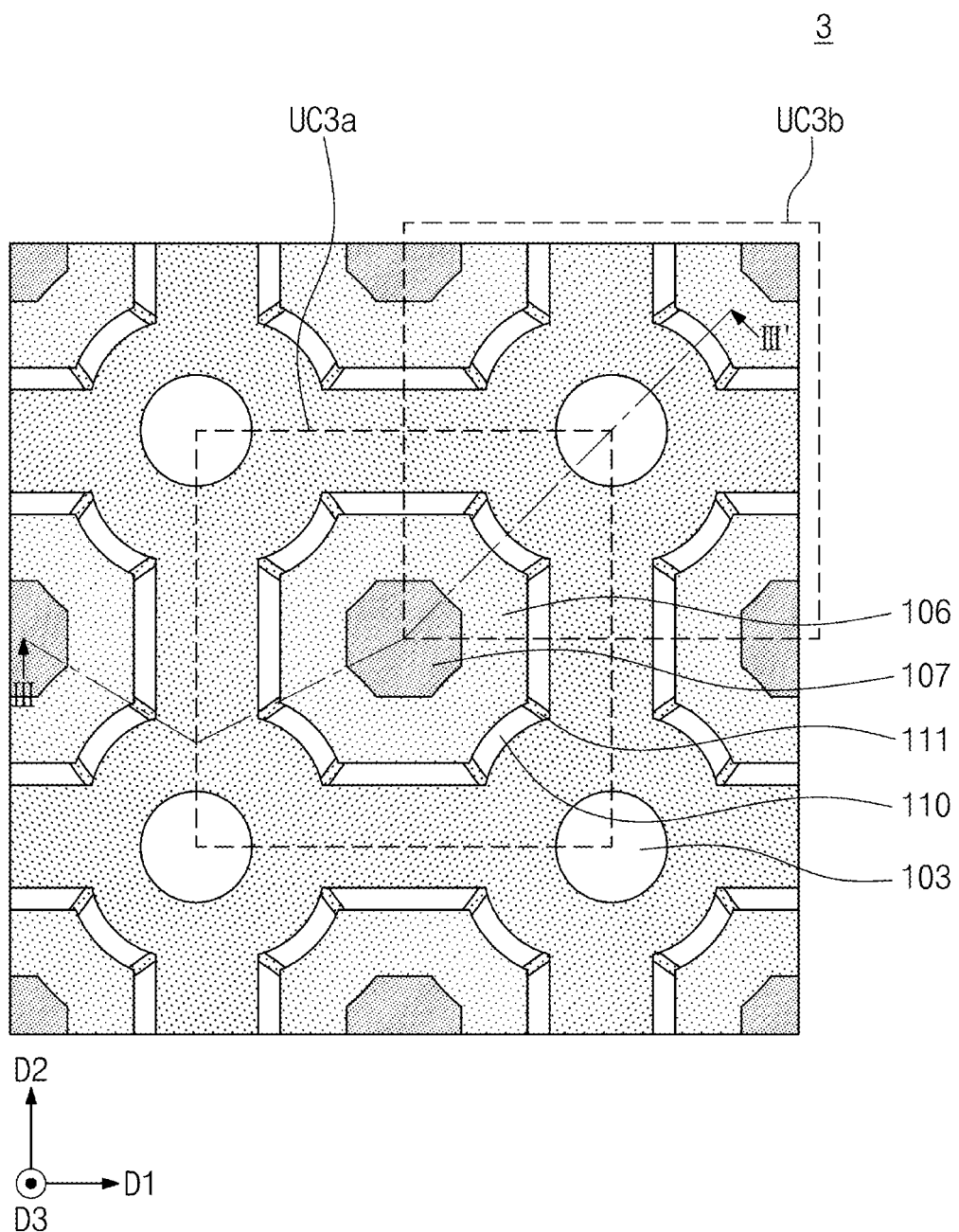
FIG. 3a is a plan view of a MOS controlled thyristor device according to some embodiments.
Figure 3B:
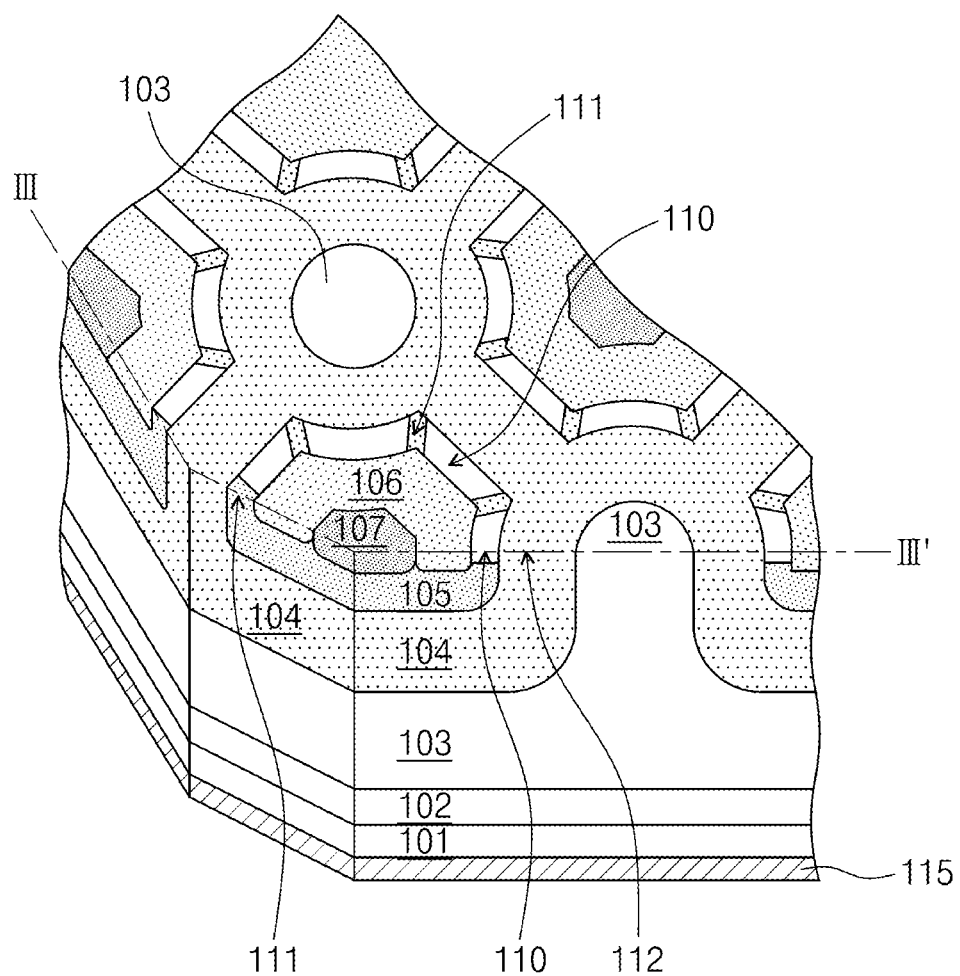

FIG. 3a is a plan view of a MOS controlled thyristor device according to some embodiments. FIG. 3b is a cross-sectional view taken along line of FIG. 3a. In order to show the components more clearly, some components of FIG. 3b are omitted in FIG. 3a. Since the above-described contents have been described in FIGS. 1a and 1c except for following contents to be described below, the duplicated contents will be omitted.

Referring to FIGS. 3a and 3b, a MOS controlled thyristor device 3 according to some embodiments may include a plurality of third unit cells UC3a or UC3b. The third unit cells UC3a or UC3b may have a structure repeated along the first direction D1 and the second direction D2. In view of planarity, a second doped region 107 may have an octagonal shape having four concave sides and four straight sides. In view of planarity, a first doped region 106 may have an octagonal ring shape. In view of planarity, a first doping pattern 110 may have a segmented octagonal ring. Inner and outer sides of the octagonal ring may have four concave sides and four straight sides.

The doping pattern 110 may have segmented portions at any portion of the octagonal ring, and the segmented portions may expose a top surface 111 of an upper emitter region 105. Alternatively, the doping pattern 110 may have segmented portions at a corner portion of the octagonal ring, and the segmented portions may expose the top surface 111 of the upper emitter region 105 as illustrated in the drawings. A portion of the top surface 111 of the exposed upper emitter region 105 may be formed adjacent to a corner portion of a first doped region 106. That is, the portion of the exposed top surface 111 of the upper emitter region 105 may be disposed at the corner portion of the first doping pattern 110.

As illustrated in FIGS. 1a and 1b, the doping pattern 110 may serve as a channel for an off-FET, and a portion of the exposed top surface 112 of the upper base region 104 may serve as a channel for an on-FET. A portion of the exposed top surface 111 of the upper emitter region 105 may serve as a flow path of source current for the on-FET. According to the concept of the present invention, the doping pattern 110 may expose a top surface of the upper emitter region 105 at the corner portion of the first doped region 106 to prevent the off-FET from being non-uniformly turned on due to electric field concentration or the like and improve operation characteristics of the on-FET.

Embodiment 1-4

Figure 4A:
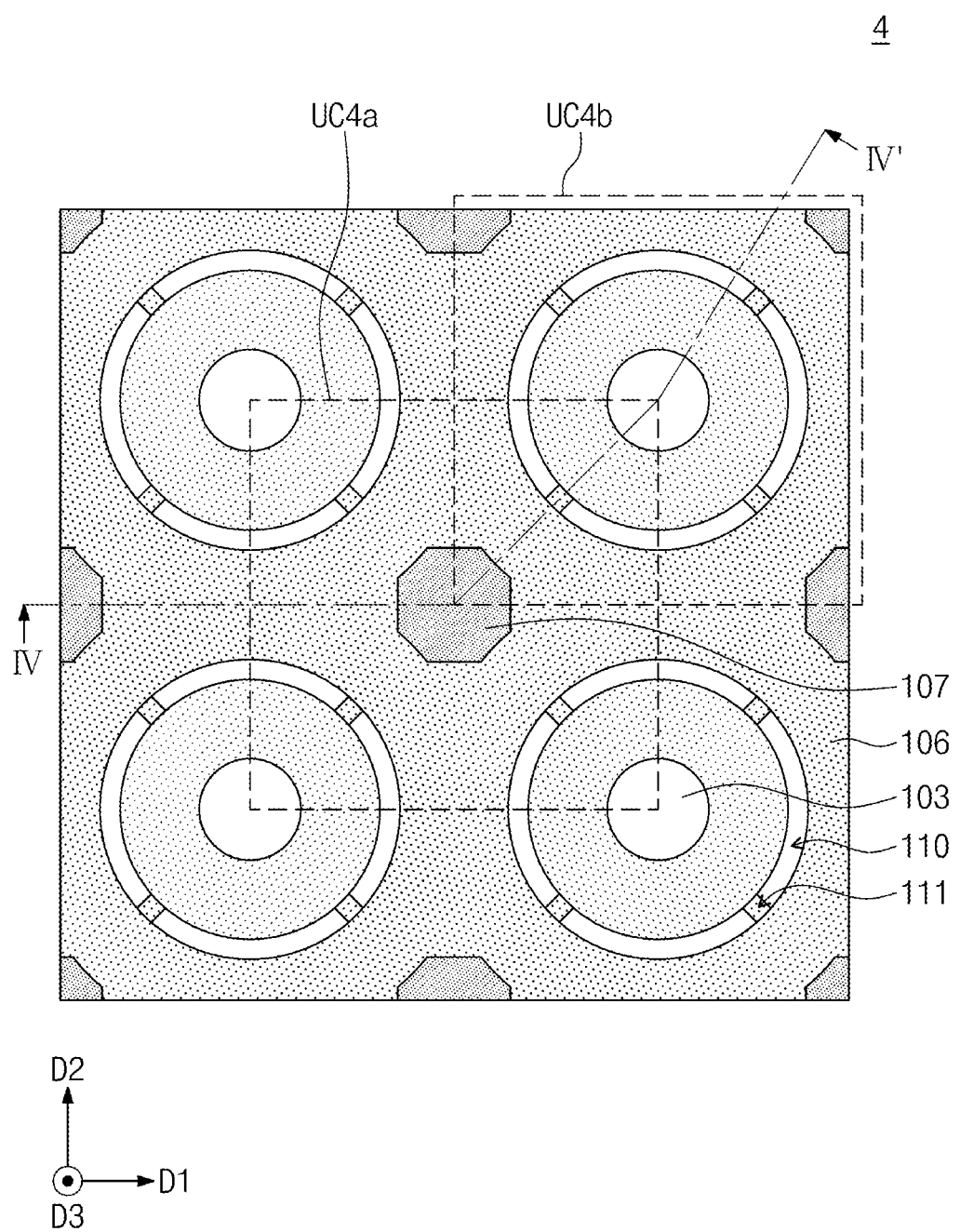
FIG. 4a is a plan view of a MOS controlled thyristor device according to some embodiments of the present invention.
Figure 4B:
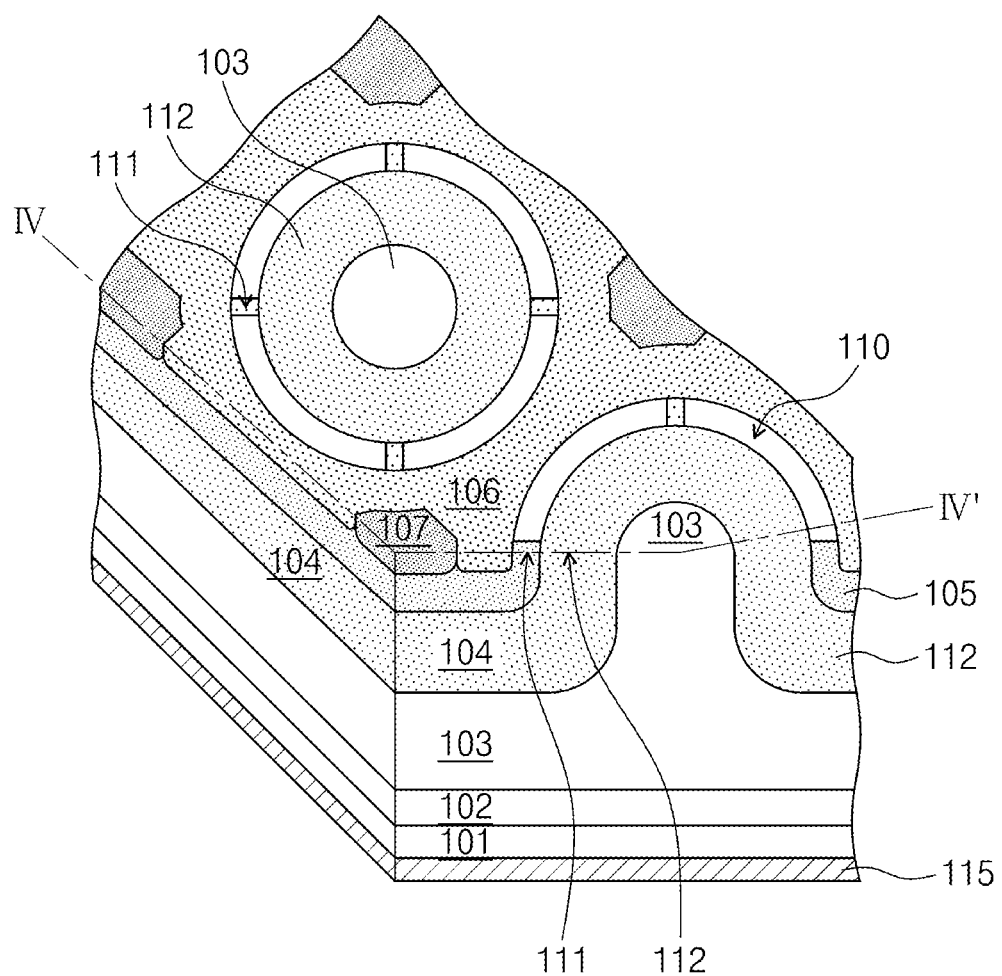

FIG. 4a is a plan view of a MOS controlled thyristor device according to some embodiments of the present invention. FIG. 4b is a cross-sectional view taken along line IV-IV' of FIG. 4a. In order to show the components more clearly, some components of FIG. 4b are omitted in FIG. 4a. Since the above-described contents have been described in FIGS. 1a and 1c except for following contents to be described below, the duplicated contents will be omitted.

Referring to FIGS. 4a and 4b, a MOS controlled thyristor device 4 according to some embodiments may include a plurality of third unit cells UC4a or UC4b. A second doped region 107 may have an octagonal shape. The first doped region 106 may surround the second doped region 107. The first doped region 106 may surround a doping pattern 110. The doping pattern 110 may have a segmented ring shape, and top surfaces 111 of an upper emitter region 105 may be exposed at the segmented portions. The exposed top surface 111 of the upper emitter region 105 may be disposed adjacent to an exposed top surface of a lower base layer 103. The exposed top surface 111 of the upper emitter region 105 may be spaced apart from the exposed top surface of the lower base layer 103 with a top surface of an upper base region 104 therebetween. The exposed top surface of the lower base layer 103 may have a circular shape. An exposed top surface 112 of an upper base region 104 may have a ring shape. The exposed top surface 112 of the upper base region 104 may surround the exposed top surface of the lower base layer 103.

As illustrated in FIGS. 4a and 4b, the doping pattern 110 may serve as a channel for an off-FET, and the exposed top surface 112 of the upper base region 104 may serve as a channel for an on-FET. A portion 111 of the exposed top surface of the upper emitter region 105 may serve as a flow path of source current for the on-FET.

Embodiment 2

Figure 5:
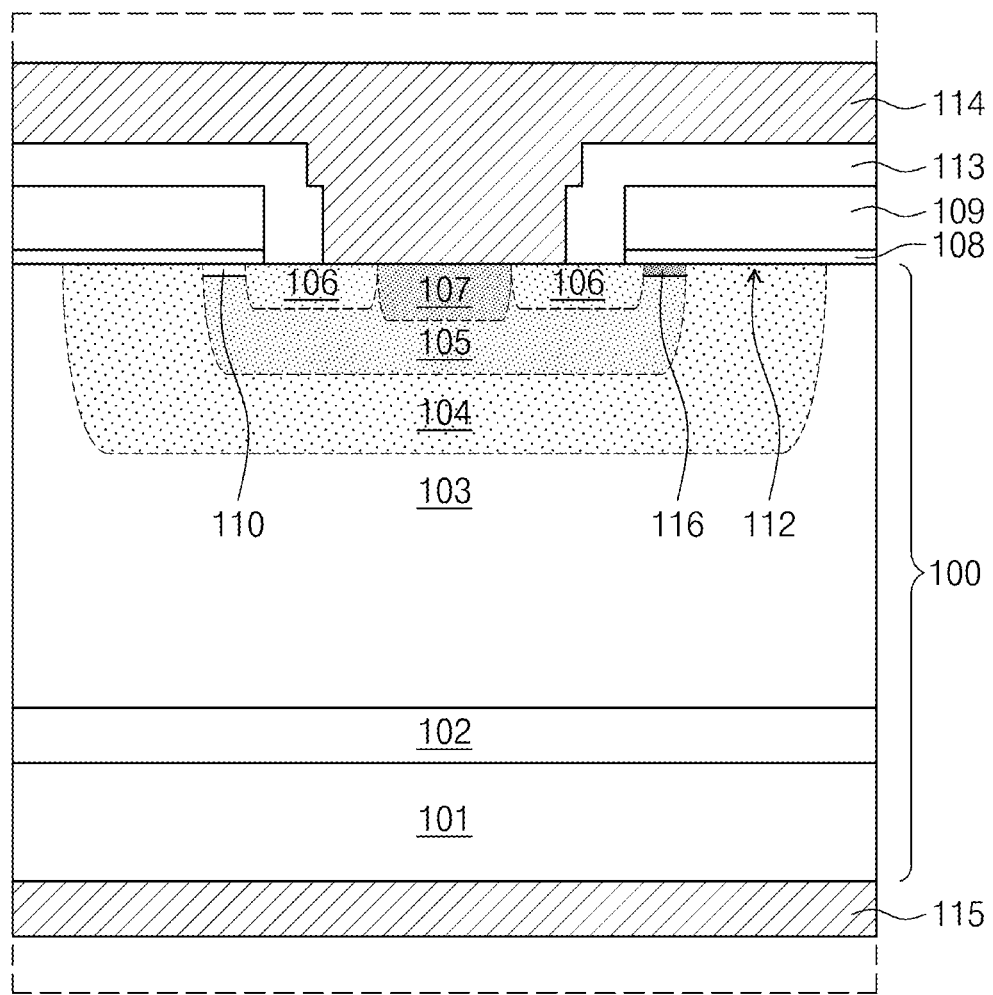
FIG. 5 is a cross-sectional view illustrating a unit cell of the MOS controlled thyristor device according to some embodiments.
Figure 5:
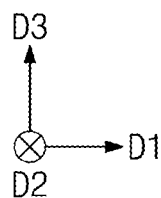

FIG. 5 is a cross-sectional view illustrating a unit cell 5 of the MOS controlled thyristor device according to some embodiments. Since the above-described contents have been described in FIGS. 1a and 1b except for following contents to be described below, the duplicated contents will be omitted.

Referring to FIG. 5, a first doping pattern 110 and a second doping pattern 116 may be provided in an upper portion of an upper emitter region 105. The first doping pattern 110 may correspond to the doping pattern 110 described above.

The second doping pattern 116 may be formed on a portion of a top surface 111 of an upper emitter region 105 exposed from the first doping pattern 110. The second doping pattern 116 may include a second conductive type. The second doping pattern 116 may include, for example, an n-type. A concentration of the second conductive type of the second doping pattern 116 may be greater than that of a second conductive type of the upper emitter region 105.

An area of the top surface of the first doping pattern 110 may be larger than that of the second doping pattern 116.

According to the concept of the present invention, since the second doping pattern 116 is provided, a current flow of the on-FET may be smoother. In addition, a concentration of an upper base region 104 may increase, and thus, a concentration of a channel region 112 of the on-FET may increase so that a turn-on gate voltage stably increases to several V or more. According to the concept of the present invention, the second doping pattern 116 may be applied to all of first-1, first-2, first-3, and first-4 embodiments.

Embodiment 3

Figure 6A:
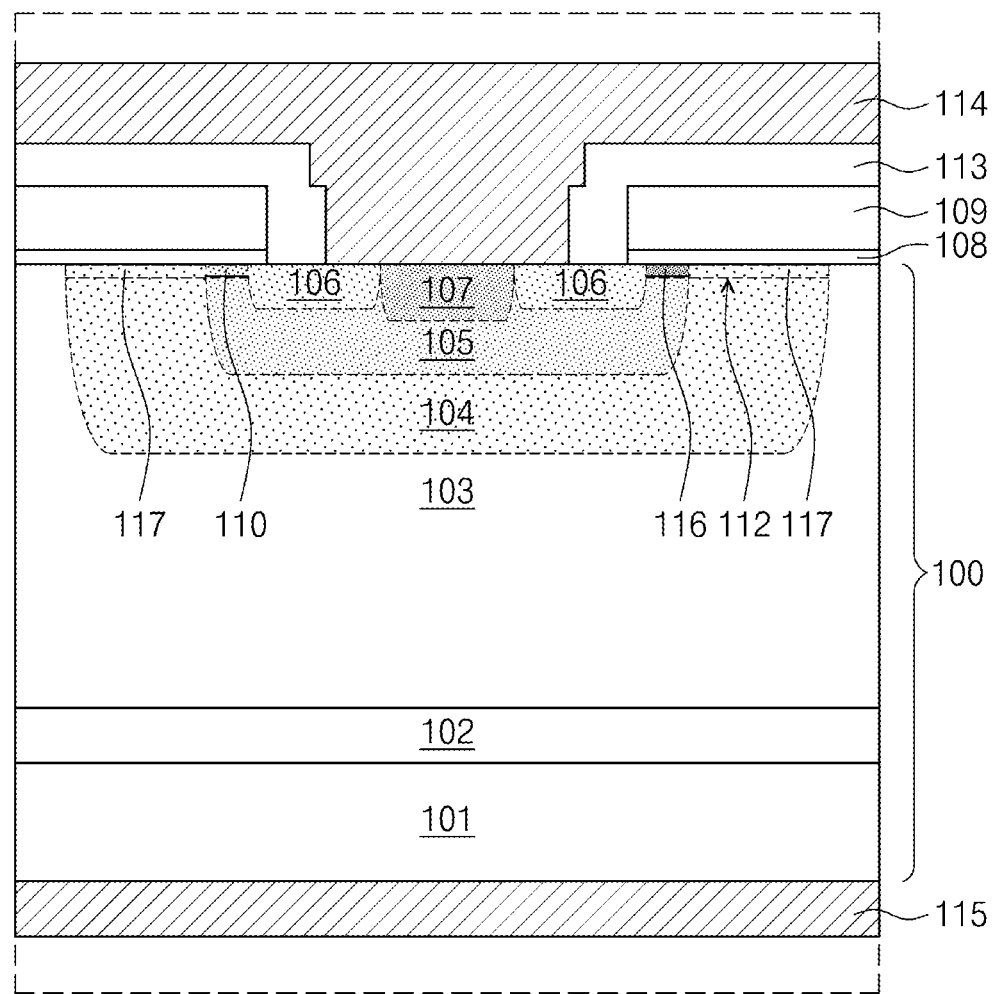
FIGS. 6a to 6c are cross-sectional views illustrating a unit cell of the MOS controlled thyristor device according to some embodiments.
Figure 6B:
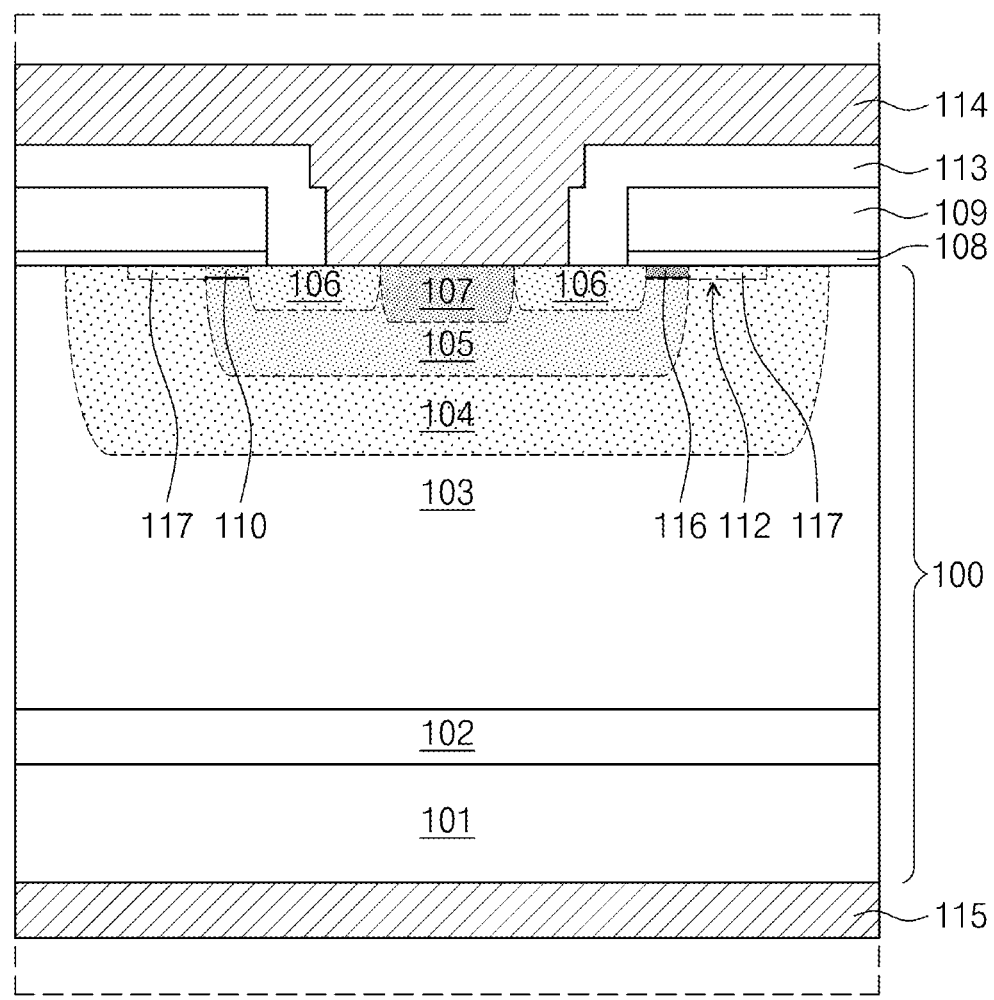
Figure 6C:
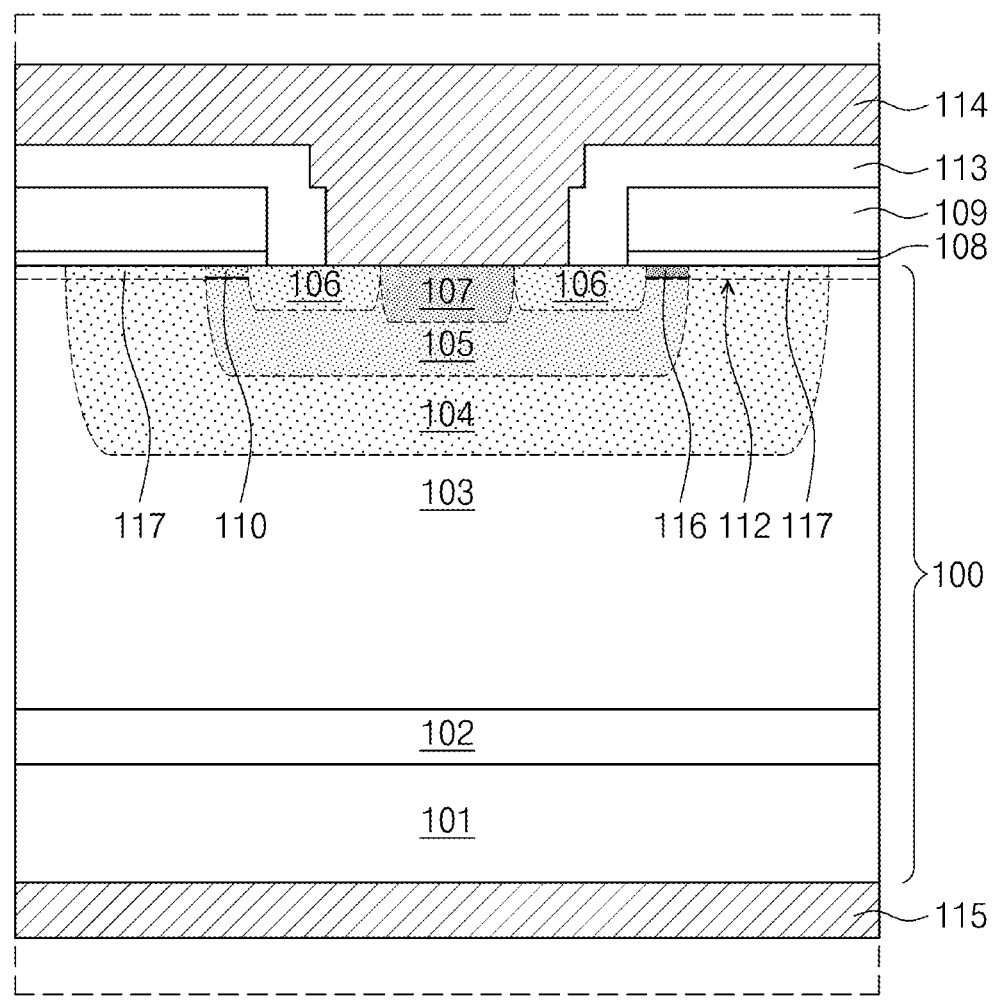

FIGS. 6a, 6b, and 6c are cross-sectional views illustrating unit cells 6, 7, and 8 of the MOS controlled thyristor device according to some embodiments. Since the above-described contents have been described in FIG. 5 except for following contents to be described below, the duplicated contents will be omitted.

Referring to FIGS. 6a to 6c, a threshold voltage control layer 117 may be provided on a top surface portion 112 of an upper base region 104. The threshold voltage control layer 117 may include a first conductive type. The threshold voltage control layer 117 may include, for example, a p-type. The threshold voltage control layer 117 may include impurities having a concentration higher than that of the upper base region 104.

Referring to FIG. 6a, the threshold voltage control layer 117 may be formed over an entire top surface 112 of the upper base region 104. A doping concentration of each of a first doped region 106, a second doped region 107, and a second doping pattern 116 may be higher than that of the threshold voltage control layer 117.

According to some embodiments, the second doping pattern 116 may be omitted.

As will be described later, the threshold voltage control layer 117 is formed after a first doping pattern 110 is formed. According to some embodiments, the threshold voltage control layer 117 may be formed simultaneously with the first doping pattern 110.

According to some embodiments, the threshold voltage control layer 117 may be formed on a portion of a top surface portion 112 of the upper base region 104 as illustrated in FIG. 6b.

According to some embodiments, as illustrated in FIG. 6c, the threshold voltage control layer 117 may be disposed over an entire first surface 100a of a substrate 100. In this case, the concentration of each of the first doped region 106, the second doped region 107, and the second doping pattern 116 may be higher than that of the threshold voltage control layer 117.

According to the concept of the present invention, the threshold voltage control layer 117 may be applied to all of the first-1, first-2, first-3, and firths-4 embodiments.

Manufacturing Method (Embodiment 1)

FIGS. 7a to 7h are cross-sectional views illustrating a method for manufacturing a MOS controlled thyristor device according to some embodiments.

Figure 7A:
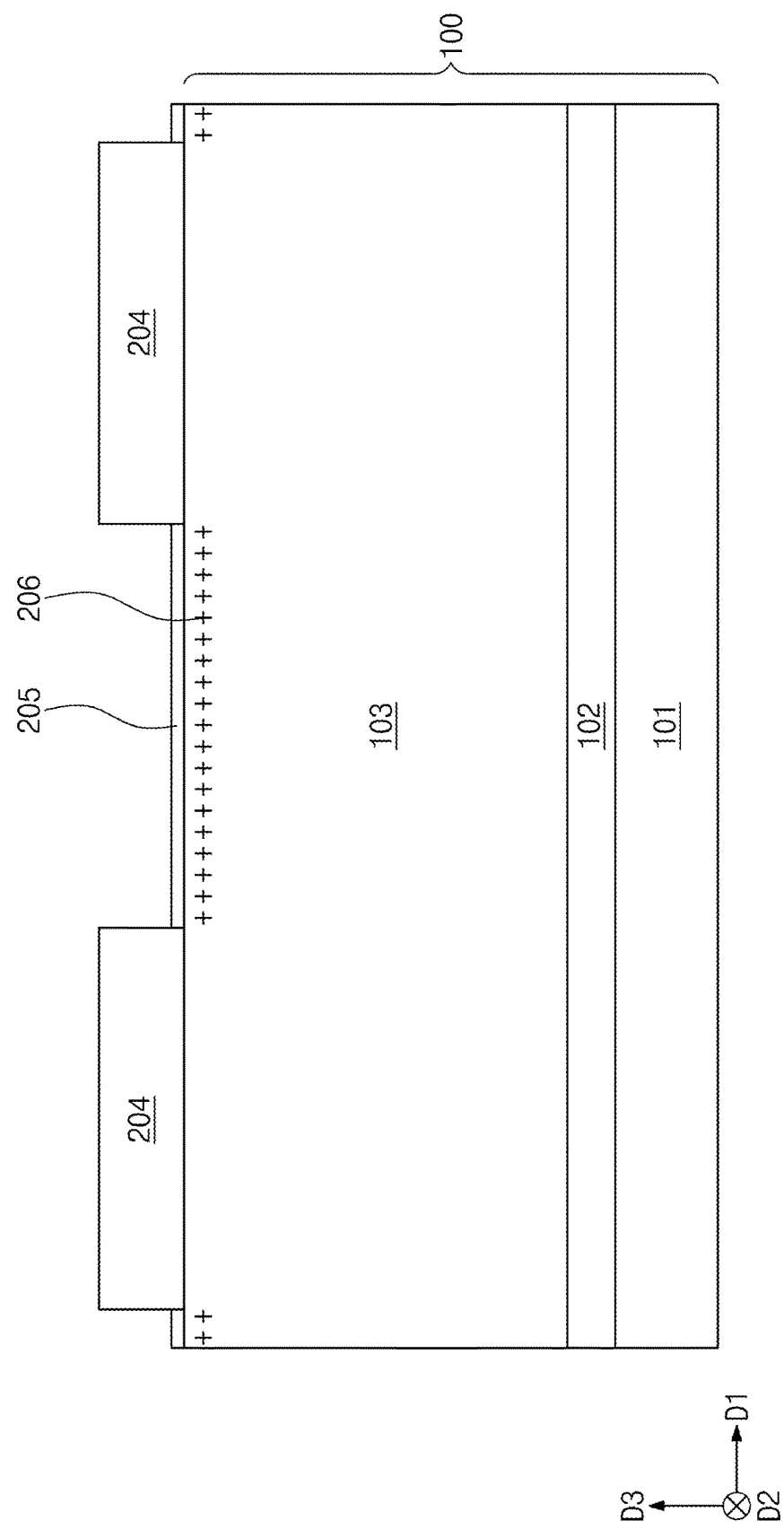

Referring to FIG. 7A, a substrate 100 may be provided. The substrate 100 may include a lower emitter layer 101, a buffer layer 102, and a lower base layer 103, which are sequentially laminated. The buffer layer 102 and the lower base layer 103 may be sequentially formed on the lower emitter layer 101 to manufacture the substrate 100. Alternatively, the buffer layer 102 and the lower emitter layer 101 may be formed on a rear surface of the lower base layer 103 to manufacture the substrate 100.

First oxide layer pattern 204 may be formed on a first surface 100a of the substrate 100. Each of the first oxide layer pattern 204 may define a region in which an upper base region 104 is to be formed. Subsequently, a second oxide layer pattern 205 may be formed between the first oxide layer patterns 204. The second oxide layer pattern 205 may protect a surface of the substrate 100 from an ion implantation process, which will be described later. The first oxide layer pattern 204 may have a thickness of about 1 μm, and the second oxide layer pattern 205 may have a thickness of 20 nm to 100 nm.

Subsequently, a p-type impurity 206 may be implanted toward the first surface 100a of the substrate 100. The p-type impurity 206 may include, for example, at least one of B or Al. An ion implantation dose of the p-type impurity 206 may be $1 \times 10^{13}$ cm$^{-2}$ to $1 \times 10^{14}$ cm$^{-2}$.

Figure 7B:
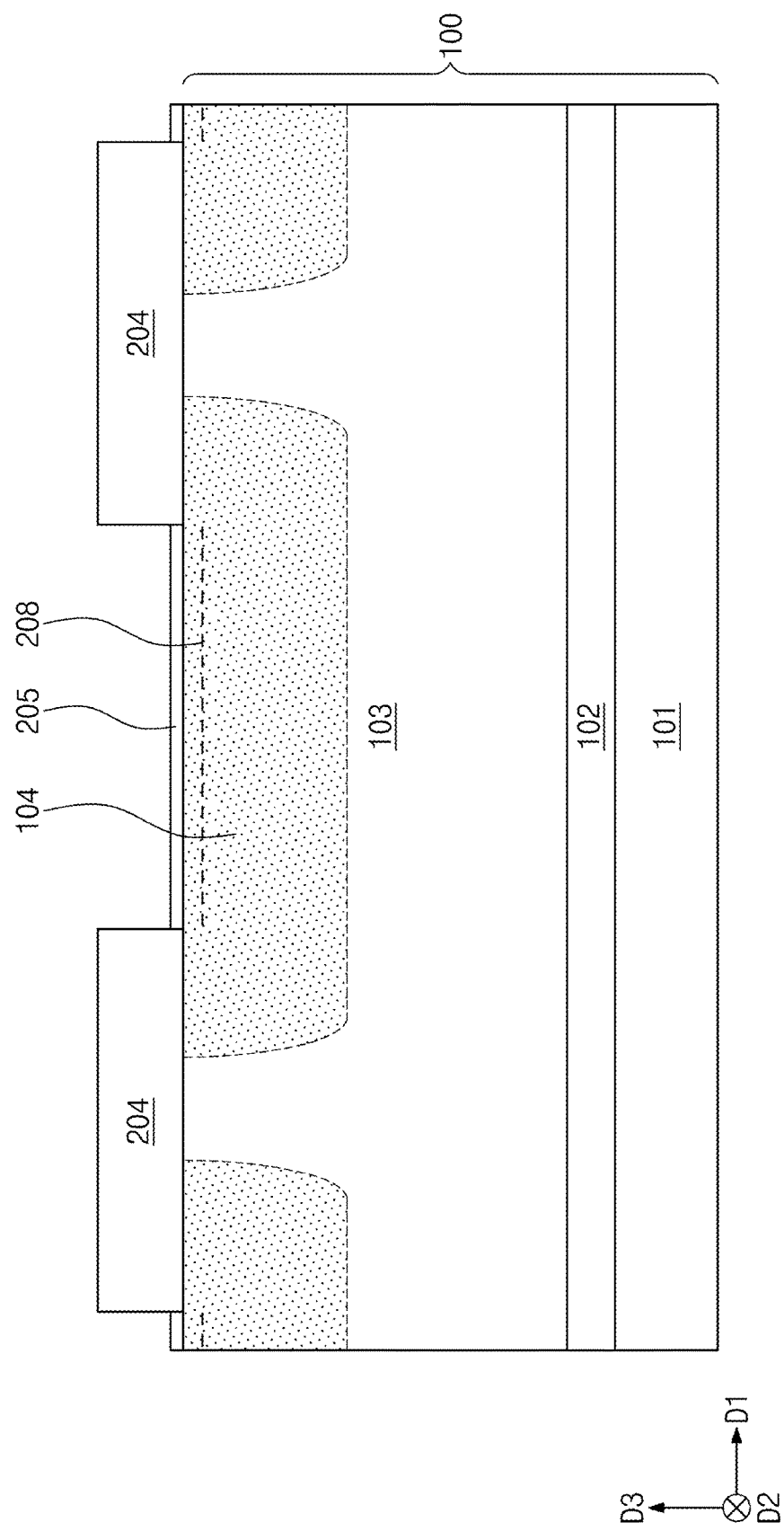

Referring to FIG. 7b, after the implantation of the p-type impurity 206, the p-type impurity 206 may be diffused into a lower portion of the lower base layer 103 by a heat treatment process at a high temperature to form the upper base region 104. A diffusion depth of the upper base region 104 may be 5 μm to 10 μm.

Subsequently, an n-type impurity 208 may be ion-implanted toward the first surface 100a of the substrate 100. The n-type impurity 208 may include, for example, at least one of P or As. An ion implantation dose of the n-type impurity may be $1 \times 10^{13}$ cm$^{-2}$ to $1 \times 10^{14}$ cm$^{-2}$.

Figure 7C:
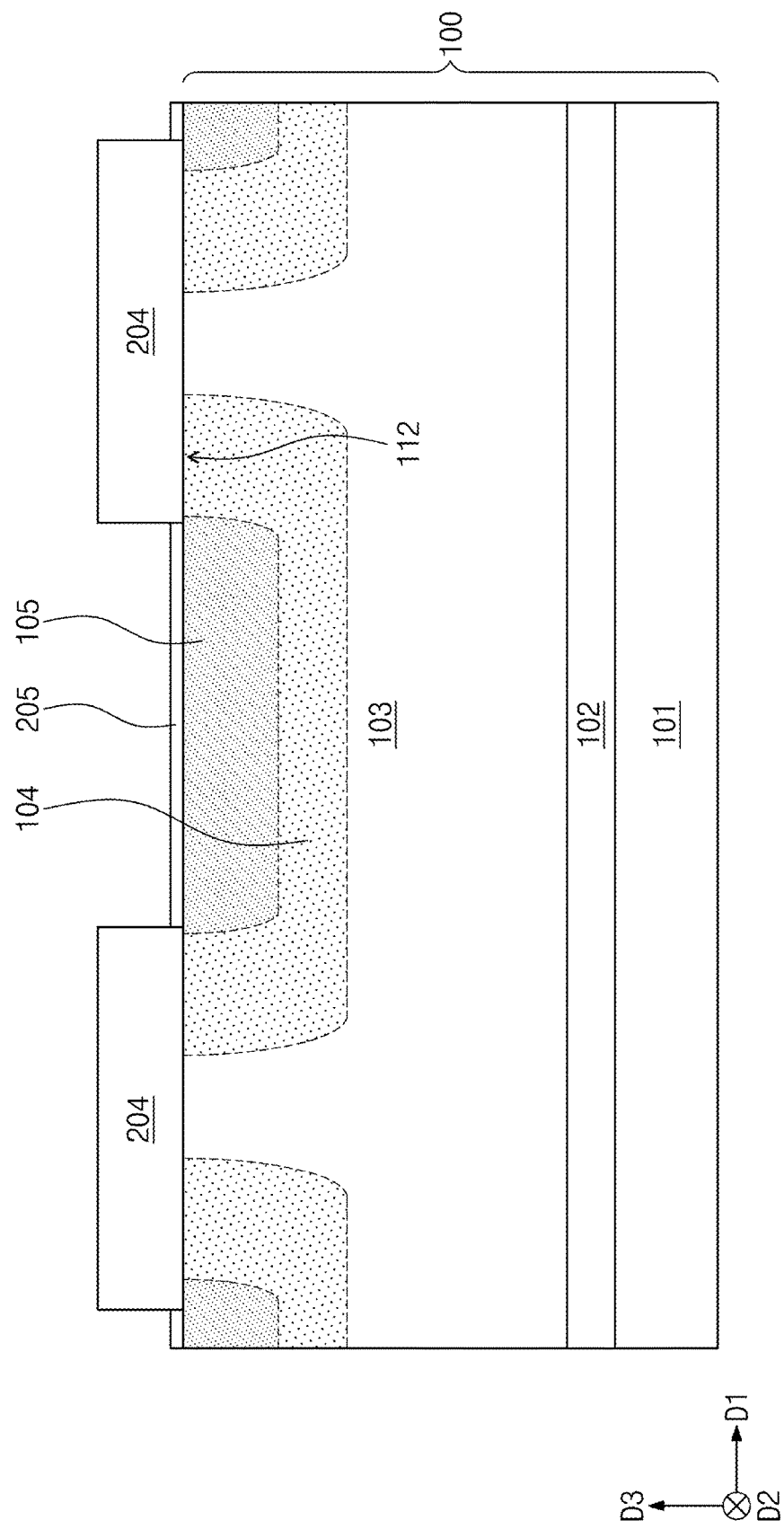

Referring to FIG. 7c, the n-type impurity 208 may be diffused downward by a heat treatment process at a high temperature to form an upper emitter region 105. A diffusion depth of the upper emitter region 105 may be 1 μm to 5 μm. A portion 112 in which the upper emitter region 105 is not formed in an upper portion of the upper base region 104 may serve as a channel of an on-FET.

Figure 7D:
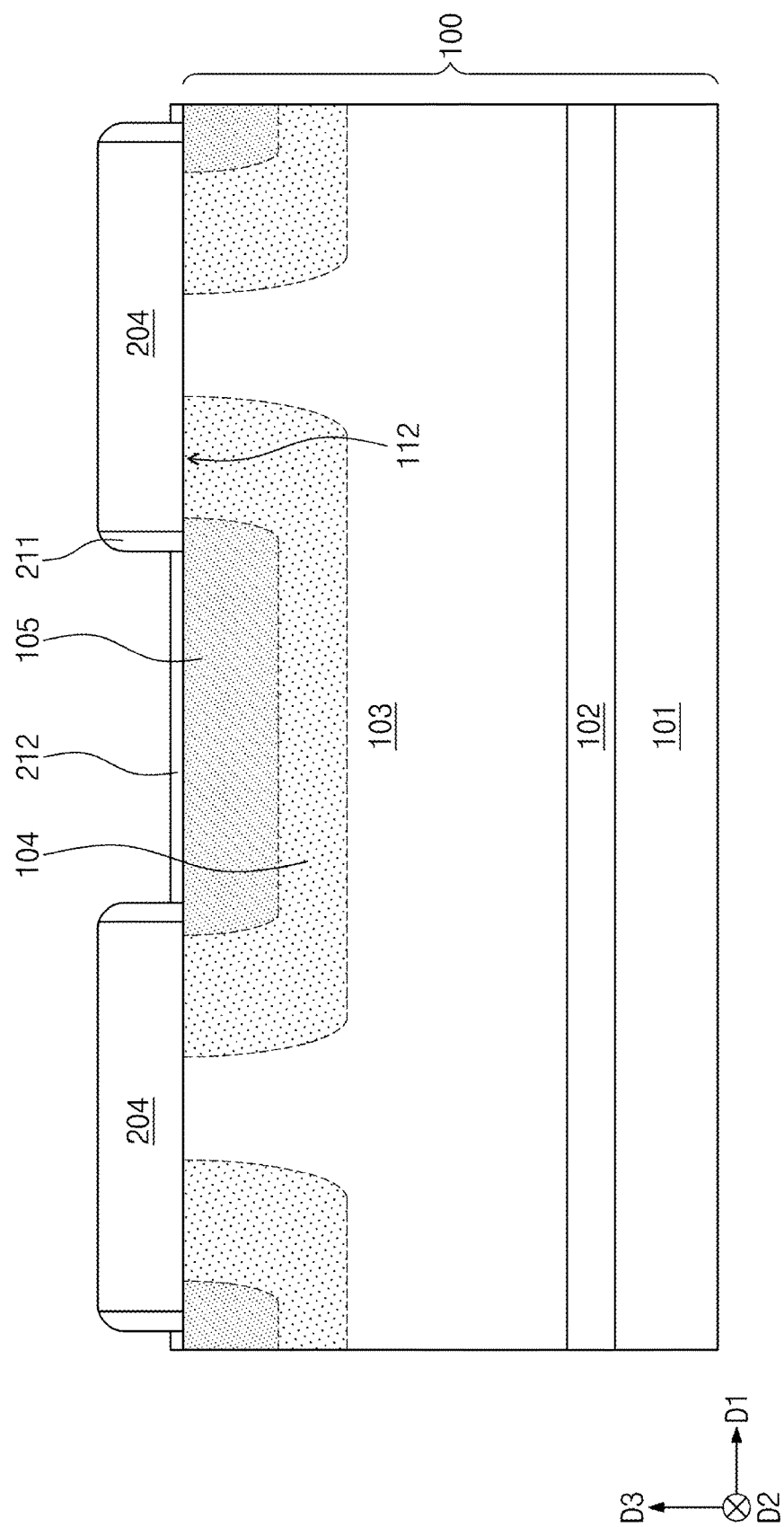

Referring to FIG. 7d, spacers 211 may be formed on both sides of the first oxide layer pattern 204. The spacers 211 may be formed through an etch back process after depositing an oxide layer or a nitride layer on the first oxide layer pattern 204. Subsequently, a third oxide layer pattern 212 may be formed. The third oxide layer pattern 212 may be thicker than the second oxide layer pattern 205. A thickness of each of the spacers 211 may be 300 nm to 1000 nm, and a thickness of the third oxide layer pattern 213 may be 20 nm to 50 nm.

Referring to FIG. 7e, a first photomask pattern 214 may be formed on the upper emitter region 105. The p-type impurity (B, Al, etc.) may be ion-implanted through an ion implantation process by using the first photomask pattern 214 as a mask. An ion implantation dose of the P-type impurity may be $1 \times 10^{15}$ cm$^{-2}$ or more. A first doped region 106 may be formed by the ion implantation process, and the first doped region 106 may serve as a drain of an off-FET. A portion of a top surface 216 of the upper emitter region 105 between the first doped region 106 and the upper base region 104 may be defined as a channel region 216 of the off-FET. According to the concept of the present invention, an off-FET channel region 216 having a short and uniform length may be defined by a self-aligning process through the formation of the spacer 211 and the ion implantation process.

Figure 7F:
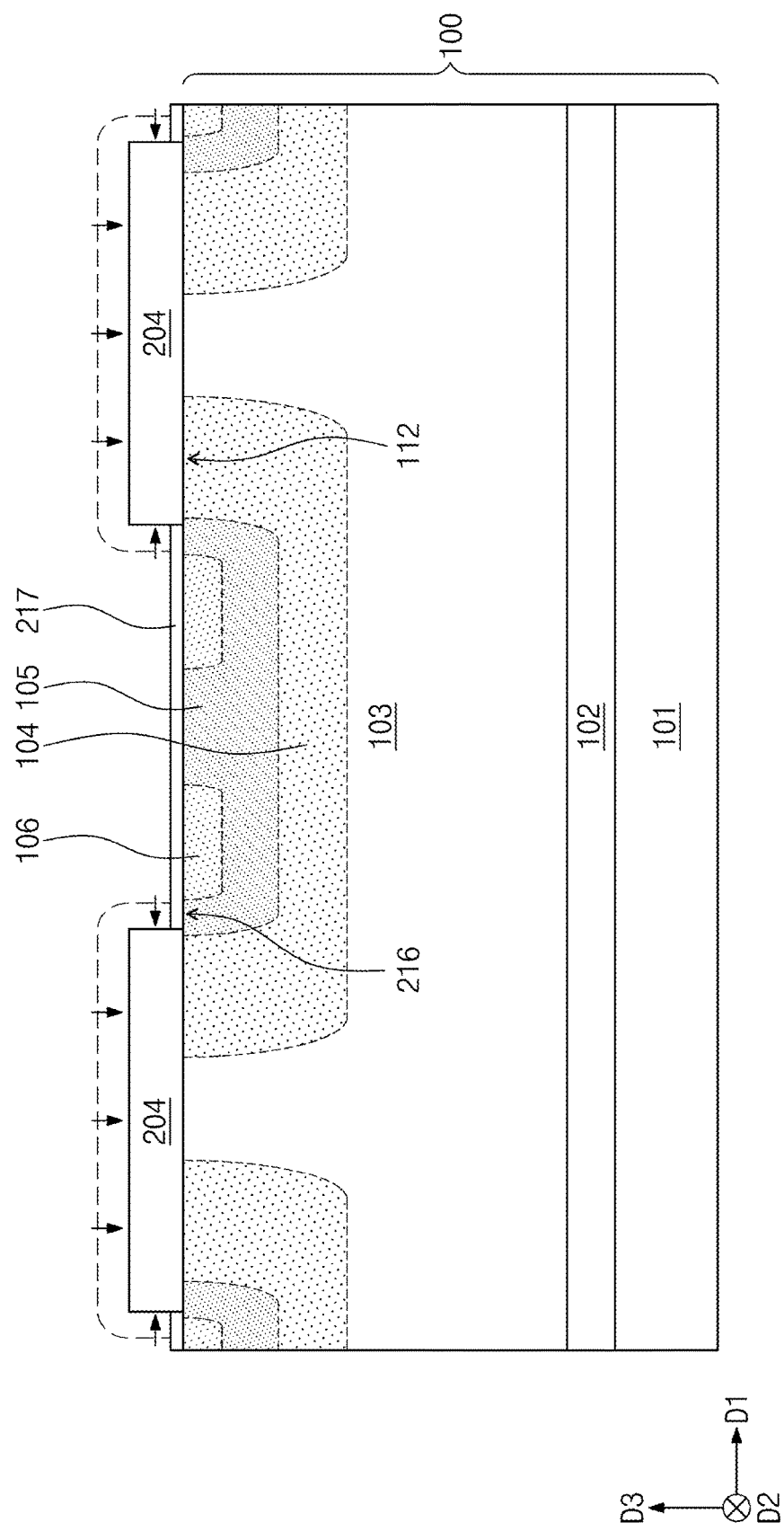

Referring to FIG. 7f, the first photomask pattern 214 may be removed. Then, an isotropic etching process may be performed to remove portions of the spacer 211 and the first oxide layer pattern 204. The off-FET channel region 216 may be partially exposed by etching the spacer 211 and the first oxide layer pattern 204. Here, when a material of the spacer 211 is an oxide layer grown by CVD, and the first oxide layer pattern 204 is an oxide layer grown by thermal growth, the spacer 211 may be etched more quickly. Subsequently, a fourth oxide layer pattern 217 may be formed, and a thickness of the fourth oxide layer pattern 217 may be 20 nm to 50 nm.

Figure 7G:
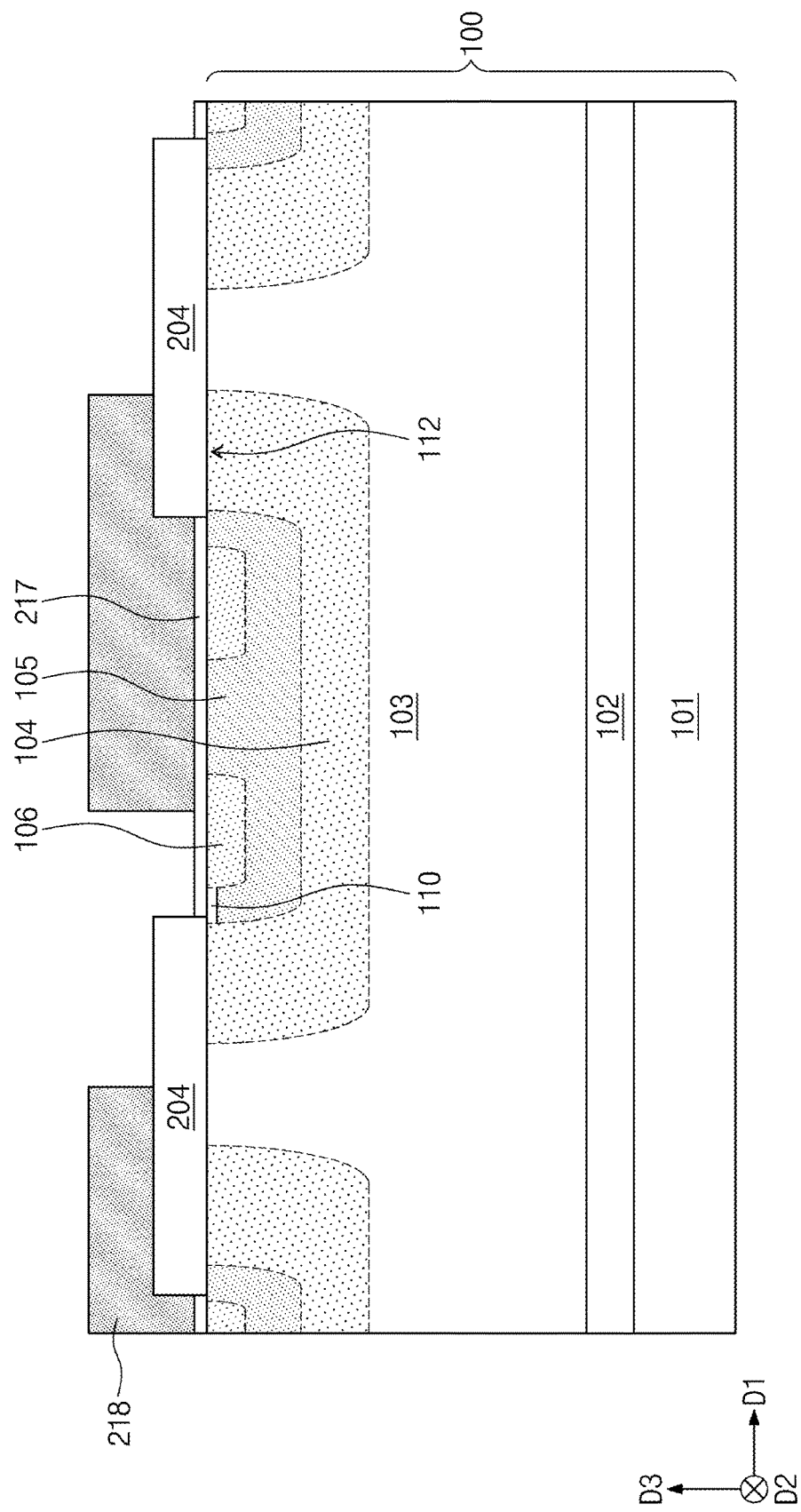

Referring to FIG. 7g, a second photomask pattern 218 may be formed. The second photomask pattern 218 may expose a portion of the off-FET channel region 216. A p-type impurity (B, Al, etc.) may be ion-implanted by using the second photomask pattern 218 as a mask. As the p-type impurity (B, Al, etc.) is ion-implanted, the first doping pattern 110 may be formed. An ion implantation dose of the p-type impurity may be, for example, $1 \times 10^{12}$ cm$^{-2}$ to $1 \times 10^{13}$ cm$^{-2}$. The first doping pattern 110 may serve as an off-FET channel 110.

Figure 7H:
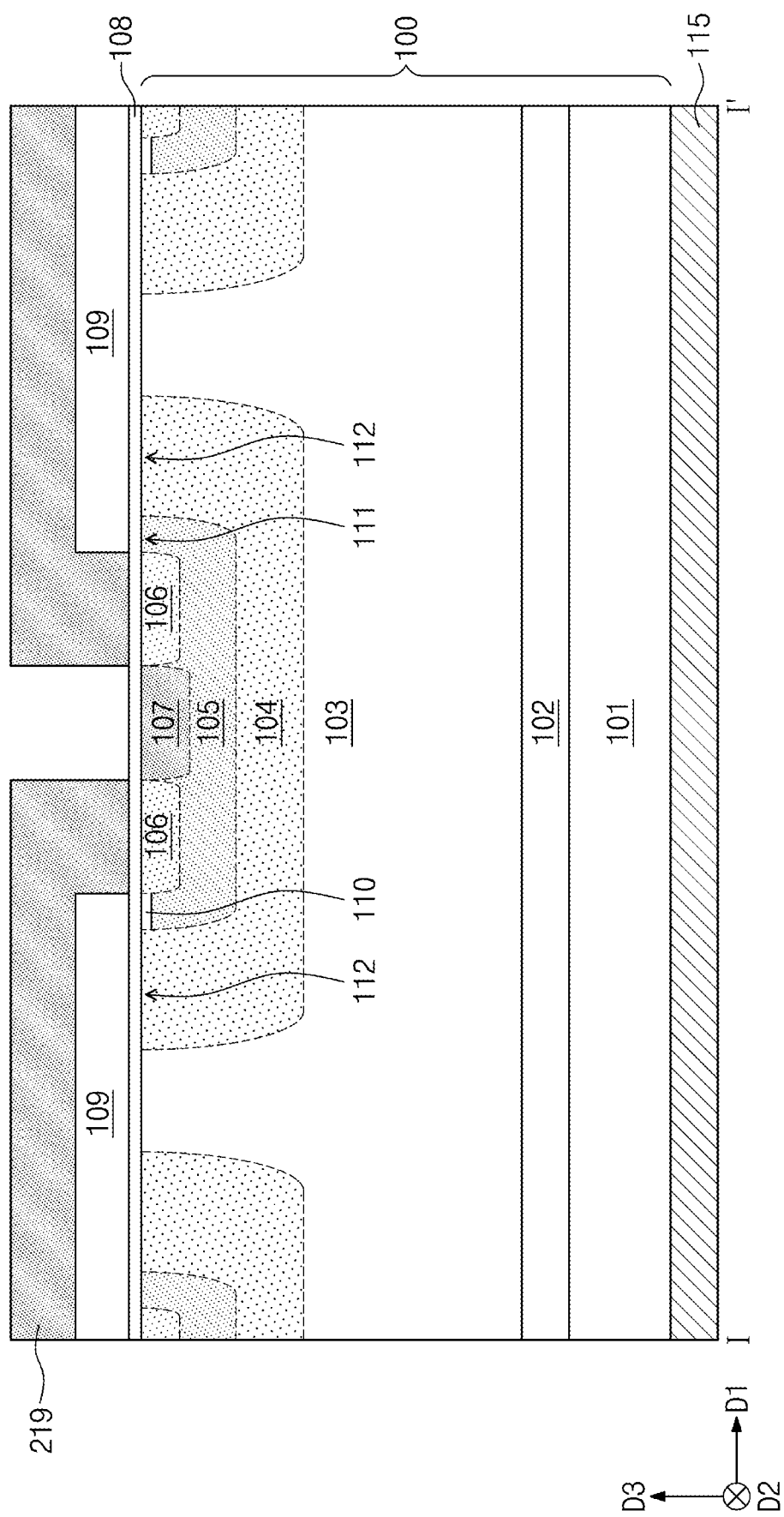

Referring to FIG. 7h, the first oxide layer pattern 204 and the fourth oxide layer pattern 217 may be removed. A gate insulating layer 108 and a gate pattern 109 may be formed. The gate pattern 109 may be formed through growth of a gate material layer and patterning of the gate material layer. Subsequently, a third photomask pattern 219 may be formed. The third photomask pattern 219 may define a region in which the second doped region 107 is to be formed. An n-type impurity (P or As) may be implanted by using the third photomask pattern 219 as a mask. An ion implantation dose of the n-type impurity may be $1 \times 10^{15}$ cm$^{-2}$ or more.

Referring back to FIG. 1B, after depositing the interlayer insulating layer 113, the interlayer insulating layer 113 and the gate insulating layer 108 may be etched. Subsequently, a cathode electrode 114 may be formed on the first surface 100a of the substrate 100, and an anode electrode 115 may be formed on a second surface 100b of the substrate 100.

Manufacturing Method (Embodiment 2)

Figure 8:
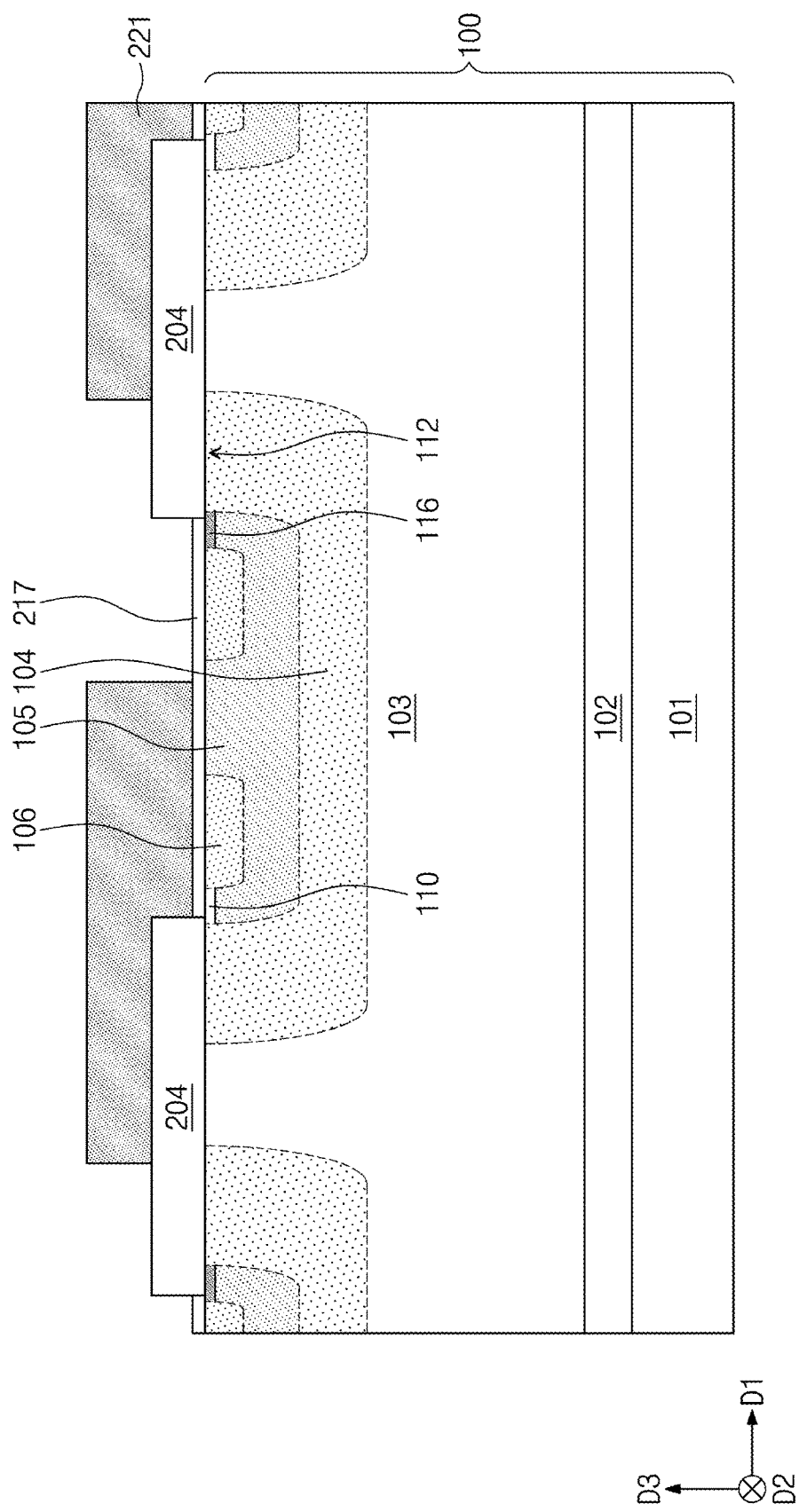
FIG. 8 is a cross-sectional view illustrating a method for manufacturing a MOS controlled thyristor device according to some embodiments.

FIG. 8 is a cross-sectional view illustrating a method for manufacturing a MOS controlled thyristor device according to some embodiments.

Referring to FIGS. 7g and 8, after the first doping pattern 110 is formed, and the second photomask pattern 218 is removed, a fourth photomask pattern 221 is formed on the first surface 100a of the substrate 100. The fourth photomask pattern 221 may expose a portion of the other side of the off-FET channel region 216. The n-type impurity (P or As) are ion-implanted, and an ion-implantation concentration may be $1 \times 10^{12}$ cm$^{-2}$ to $1 \times 10^{14}$ cm$^{-2}$. A second doping pattern 116 may be formed by the ion implantation. The fourth photomask pattern 221 may be removed.

Subsequently, the MOS controlled thyristor device of FIG. 5 may be formed through the manufacturing process of FIGS. 7h and 1B described above.

Manufacturing Method (Embodiment 3)

Figure 9:
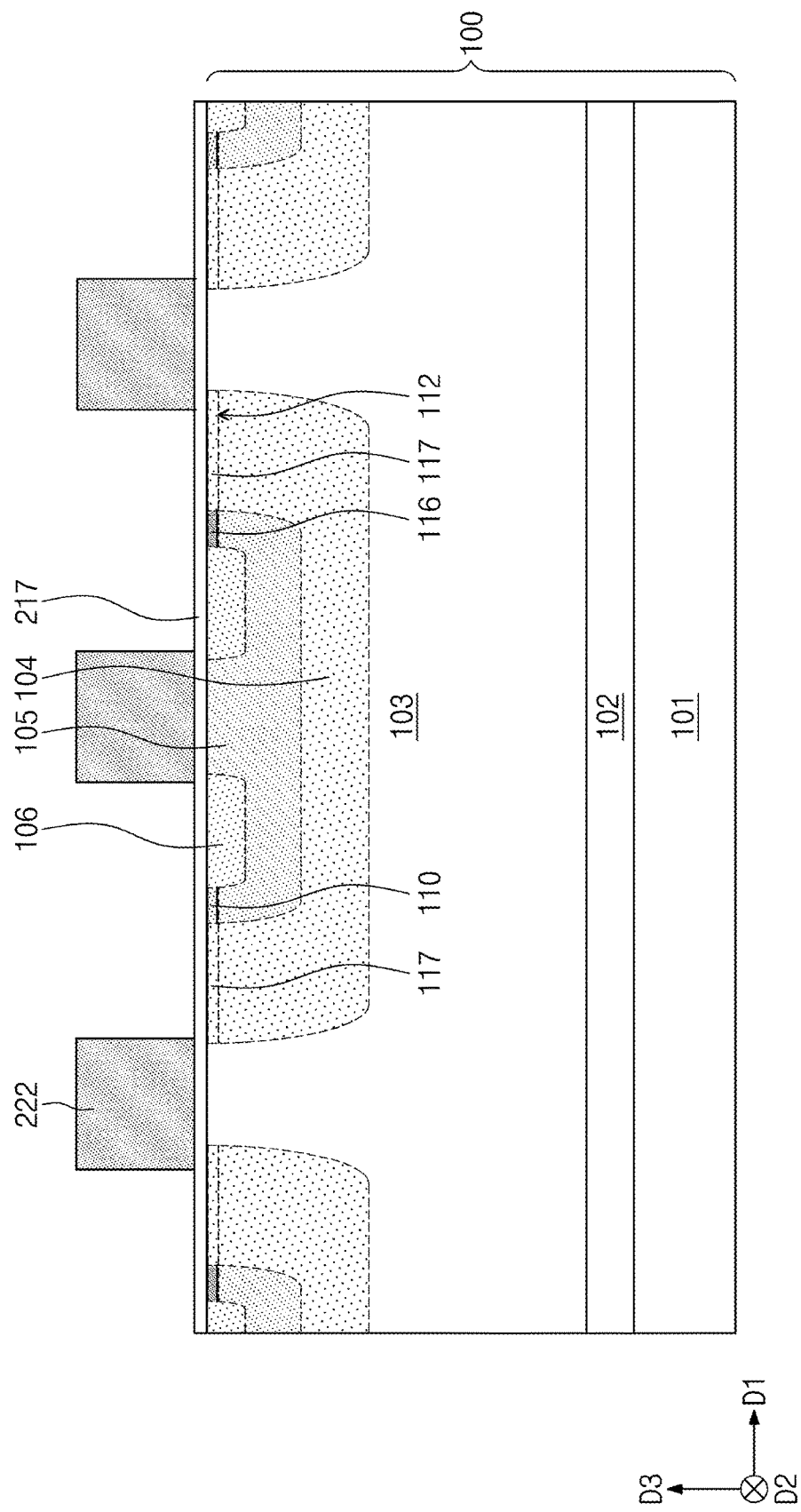
FIG. 9 is a cross-sectional view illustrating a method for manufacturing a MOS controlled thyristor device according to some embodiments.

FIG. 9 is a cross-sectional view illustrating a method for manufacturing a MOS controlled thyristor device according to some embodiments.

Referring to FIGS. 8 and 9, after the second doping pattern 116 and the fourth photomask pattern 221 are removed, the first oxide layer pattern 204 and the fourth oxide layer pattern 217 may be removed. Subsequently, a fifth photomask pattern 222 may be formed. The fifth photomask pattern 222 may expose a portion or the entire top surface 112 of the upper base region 104. The top surface 112 of the upper base region 104 may serve as an on-FET channel. A threshold voltage control layer 117 may be formed by ion-implanting the p-type impurity (B, Al, etc.). An ion implantation dose of the p-type impurity may be $1 \times 10^{11}$ cm$^{-2}$ to $1 \times 10^{13}$ cm$^{-2}$.

The p-type impurity of the threshold voltage control layer 117 may be simultaneously ion-implanted into the first doping pattern 110, the second doping pattern 116, and a portion of the top surface 112 of the upper base region 104. In consideration of this process, an ion implantation dose in the process of forming the first doping pattern 110 and the second doping pattern 116 may be controlled. Alternatively, a dose of the ion implantation process of the threshold voltage control layer 117 may be controlled. According to some embodiments, the ion implantation process may be performed on the entire first surface 100a of the substrate 100 without forming the fifth photomask pattern 222.

The first doping pattern 110 may be simultaneously formed by the process of forming the threshold voltage control layer 117 of FIG. 9 without performing the process described with reference to FIG. 7g.

After the ion implantation process, the fifth photomask pattern 222 may be removed. Subsequently, the MOS controlled thyristor device of FIGS. 6a, 6b and 6c may be formed through the manufacturing process of FIGS. 7h and 1B described above.

Figure 10A:
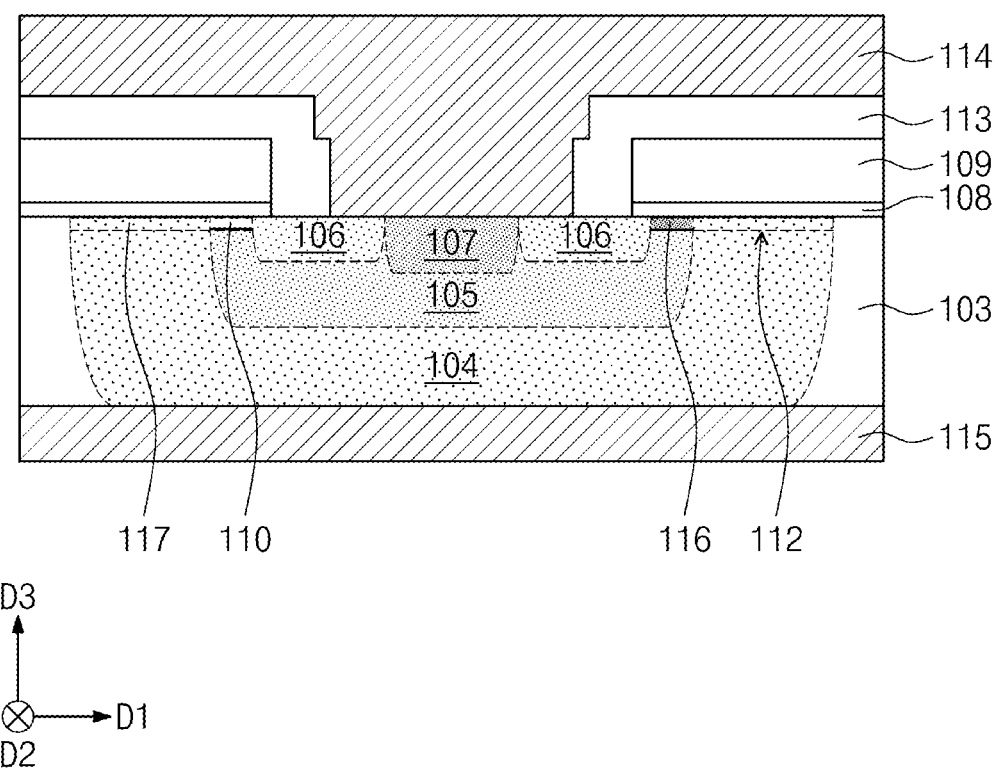
FIG. 10a is a cross-sectional view of a MOS controlled thyristor device according to a comparative example.
Figure 10B:
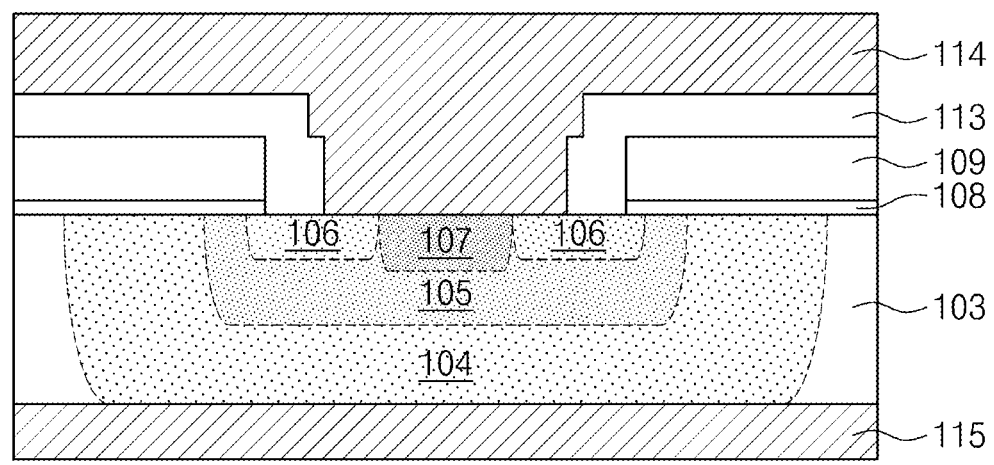
FIG. 10b is a cross-sectional view of a MOS controlled thyristor device according to some embodiments.

FIG. 10a is a cross-sectional view of a MOS controlled thyristor device according to some embodiments. FIG. 10b is a cross-sectional view of a MOS controlled thyristor device according to a comparative example.

FIGS. 10a and 10b illustrate a MOS controlled thyristor devices, in which the lower emitter layer 101 and the buffer layer 102 are removed from the unit cell of the MOS controlled thyristor device according to FIG. 6b, and a portion of the lower base layer 103 is removed, so as to perform 2D TCAD simulation. The upper base region 104 is in contact with the anode electrode 115.

A MOS controlled thyristor device according to an comparative example does not include the first doping pattern 110, the second doping pattern 116, and the threshold voltage control layer 117.

Figure 11A:
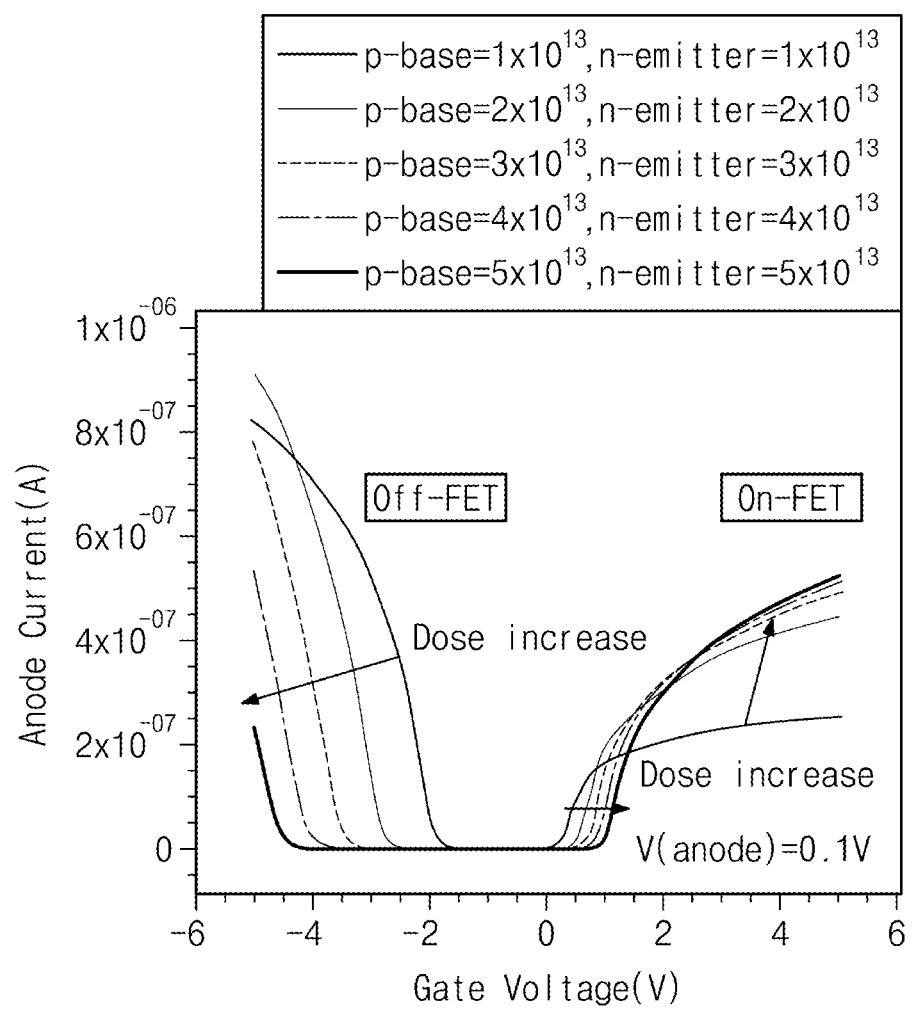
FIGS. 11a and 11b are graphs illustrating electrical properties of the MOS controlled thyristor device according to the comparative example.
Figure 11B:
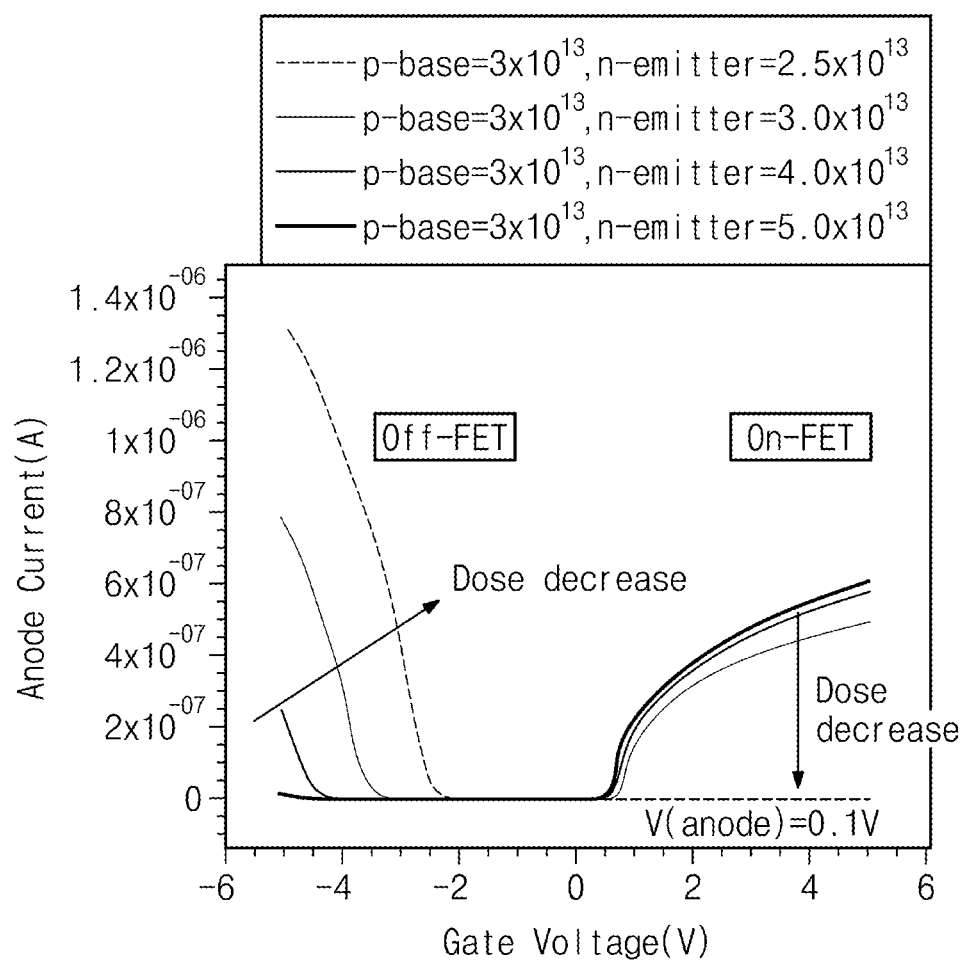

FIGS. 11a and 11b are graphs illustrating electrical properties of the MOS controlled thyristor device according to the comparative example.

Referring to FIGS. 10b and 11a, the TCAD simulation was performed by changing the ion implantation dose of the upper base region 104 and the ion implantation dose of the upper emitter region 105 in the same manner. In this case, in the MOS controlled thyristor device according to the comparative example, the threshold voltage of the on-FET increased up to 1 V as the ion implantation dose increases, while the threshold voltage of the off-FET increased significantly by more than −4 V in a negative direction.

Referring to FIGS. 10b and 11b, the ion implantation of the upper base region 104 was constantly fixed, and the ion implantation dose of the upper emitter region 105 was changed to perform the simulation. There is little change in the threshold voltage of the on-FET as the ion implantation dose of the upper emitter region 105 is changed, and when the ion implantation dose of the upper emitter region 105 is lowered below a certain value, the on-FET was not turned on.

That is, in the case of the MOS controlled thyristor device according to the comparative example as illustrated in FIGS. 10b, 11a, and 11b, it is difficult to turn off the MOS controlled thyristor device by turning on the off-FET at a voltage of 0 V. In addition, it is seen that it is difficult to allow the threshold voltage of the on-FET for turning on the MOS controlled thyristor device to stably increase to a value of 1 V or more.

Figure 12:
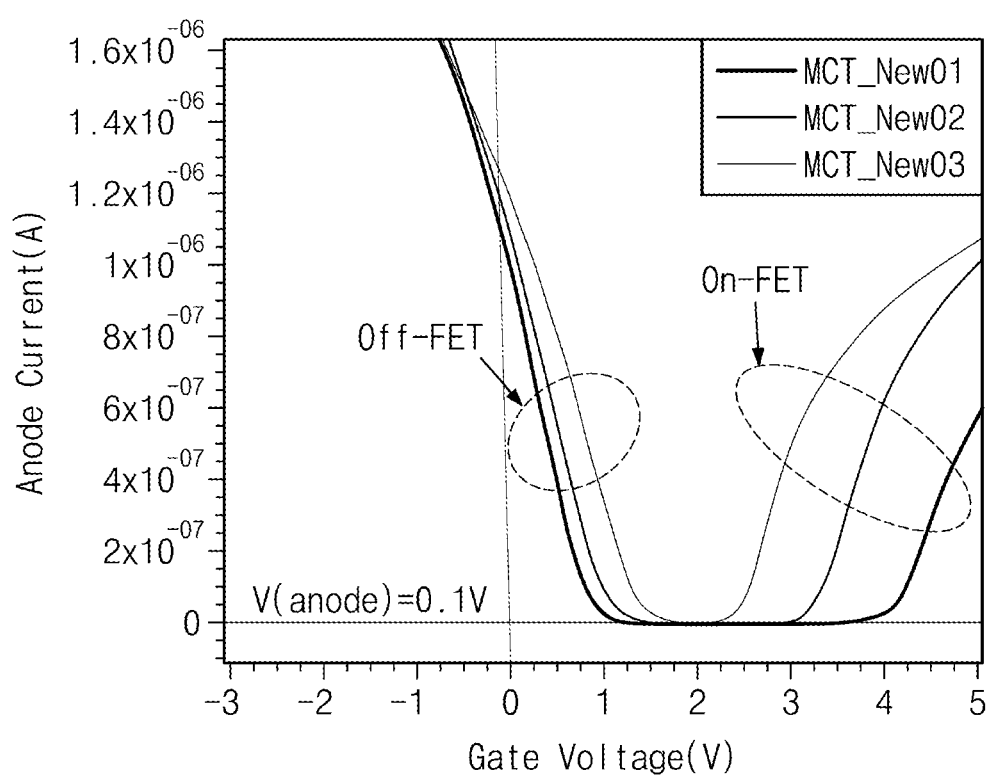
FIG. 12 is a graph illustrating electrical properties of the MOS controlled thyristor device according to some embodiments.

FIG. 12 is a graph illustrating electrical properties of the MOS controlled thyristor device according to some embodiments.

Referring to FIG. 12, the ion implantation dose of the upper base region 104 and the ion implantation dose each of the first doping pattern 110, the second doping pattern 116, and the threshold voltage control layer 117 of the MOS controlled thyristor device according to FIG. 10a were controlled to perform the TCAD simulation.

As illustrated in FIG. 12, it is seen that the off-FET is turned on at the gate voltage of 0 V, and the threshold voltage of the on-FET increases to a stable value of 2V or more depending on the ion implantation conditions.

In the above, the embodiments of the inventive concept have been described with reference to the accompanying drawings, but the present disclosure may be implemented in other specific forms without changing the technical spirit or essential features. Therefore, it should be understood that the above-disclosed embodiments are to be considered illustrative and not restrictive.

The invention claimed is:

1. A MOS controlled thyristor device, comprising:
a substrate (100) comprising a first surface (100a) and a second surface (100b), which face each other;
gate patterns (109) disposed on the first surface (100a);
a cathode electrode (114) configured to cover the gate patterns (109); and
an anode electrode (115) disposed on the second surface (100b),
wherein the substrate (100) comprises:
a lower emitter layer (101) having a first conductive type;
a lower base layer (103) having a second conductive type on the lower emitter layer (101);
an upper base region (104) provided in an upper portion of the lower emitter layer (101) and having a first conductive type, wherein the upper base region (104) is configured to expose a portion of a top surface of the lower base layer (103);
an upper emitter region (105) having a second conductive type and provided in an upper portion of the upper base region (104);
a first doped region (106) having a first conductive type and a second doped region (107) surrounded by the first doped region (106) and having a second conductive type, wherein the first and second doped regions (106, 107) are provided in an upper portion of the upper emitter region (105); and
a first doping pattern (110) having a first conductive type, which is provided on one surface of the upper portion of the upper emitter region (105),
wherein the first doping pattern (110) is interposed between the upper base region (104) and the first doped region (106) along a first direction (D1) parallel to the top surface (100a) of the substrate,
the first doping pattern (110) is configured to expose a top surface (111) of the upper emitter region (105) on the other surface of the upper portion of the upper emitter region (105),
each of the gate patterns (109) is configured to cover portions of an exposed top surface of the lower base layer (103), an exposed top surface (112) of the upper base layer (104), an exposed top surface (111) of the upper emitter region (105), a top surface of the first doping pattern (110), and a top surface of the first doped region (106),
the cathode electrode (114) is configured to cover portions of top and side surfaces of the gate pattern (109), a top surface of the second doped region (107), and a top surface of the first doped region (106), and
the first conductive type and the second conductive type are different from each other.

2. The MOS controlled thyristor device of claim 1, wherein the first doping pattern (110) has a segmented ring or line shape,
the top surface (111) of the top upper emitter region (105) is exposed by the segmented portion, and
an area of the top surface of the first doping pattern (110) is greater than that of a portion of the top surface (111) of the upper emitter region.

3. The MOS controlled thyristor device of claim 1, wherein the first doping pattern is disposed adjacent to one surface of the upper emitter region (105), and
the MOS controlled thyristor device further comprises a second doping pattern having a second conductive type and disposed on the exposed top surface (111) of the upper emitter region (105).

4. The MOS controlled thyristor device of claim 3, wherein the first doping pattern has a segmented ring or segmented line shape,
the second doping pattern (116) is disposed on the segmented portion, and
an area of the top surface of the first doping pattern is greater than that of a top surface of the second doping pattern (116).

5. The MOS controlled thyristor device of claim 1, further comprising a threshold voltage control layer (117) having a first conductive type and provided in at least a portion of the upper portion of the upper base region (104),
wherein the threshold voltage control layer (117) is in contact with the first doping pattern (110).

6. The MOS controlled thyristor device of claim 5, wherein the threshold voltage control layer (117) is disposed over the entire first surface (100a) of the substrate (100), and
a doping concentration of each of the first doped region (106) and the second doped region (107) is higher than that of the threshold voltage control layer (117).

7. The MOS controlled thyristor device of claim 5, wherein the first doping pattern (110) is disposed adjacent to one surface of the upper emitter region (105),
the MOS controlled thyristor device further comprises a second doping pattern (116) having a second conductive type and disposed on the other surface of the upper emitter region (105), and
the threshold voltage control layer (117) is in contact with the first doping pattern (110) and the second doping pattern (116).

8. The MOS controlled thyristor device of claim 5, wherein the threshold voltage control layer (117) is disposed over the entire first surface (100a) of the substrate (100), and
a doping concentration of each of the first doped region (106), the second doped region (107), and the second doping pattern (116) is higher than that of the threshold voltage control layer (117).

9. The MOS controlled thyristor device of claim 1, wherein the upper emitter region (105) is provided in plurality,
the upper emitting regions (105) are spaced apart from each other along the first direction (D1),
each of the upper emitter regions (105) is parallel to the first surface (100a) of the substrate (100) and extends along a second direction (D2) crossing the first direction (D1), and the first doped region (106) is provided in a pair within the upper emitter region (105),
the pair of first doped regions (106) are spaced apart from each other with the second doped region (107) therebetween,
each of the first doped regions (106) and the second doped region (107) extend in a line shape along the second direction (D2), and
the exposed top surface (111) of the upper emitter region (105) and the first doping pattern (110) are spaced apart from each other with the pair of doped regions (106) and the second doped region (107) therebetween in the first direction (D1).

10. The MOS controlled thyristor device of claim 9, wherein the first doping pattern (110) has a segmented line shape, the top surface (111) of the upper emitter region (105) is exposed at the segmented portion.

11. The MOS controlled thyristor device of claim 9, wherein the first doping pattern (111) has a segmented line shape, and the MOS controlled thyristor device further comprises a second doping pattern (116) provided at the segmented portion.

12. The MOS controlled thyristor device of claim 1, wherein the upper emitter region (105) is provided in plurality, and in view of planarity, the upper emitter regions (105) are arranged to be spaced apart from each other along the first direction (D1) and a second direction (D2), wherein the second direction (D2) is parallel to the first surface (100a) of the substrate (100) and crosses the first direction (D1), the second doped region (107) has a circular shape, the first doped region (106) has a ring shape, and the first doping pattern (110) has a segmented ring shape that surrounds the first doped region (106).

13. The MOS controlled thyristor device of claim 12, wherein each of the first doping pattern (110) and the exposed top surface (111) of the upper emitter region (105) is spaced apart from the exposed top surface of the lower base layer (103) with the exposed top surface (112) of the upper base region (104) therebetween.

14. The MOS controlled thyristor device of claim 1, wherein the upper emitter region (105) is provided in plurality, and in view of planarity, the upper emitter regions (105) are arranged to be spaced apart from each other along the first direction (D1) and a second direction (D2), wherein the second direction (D2) is parallel to the first surface (100a) of the substrate and crosses the first direction (D1), the second doped region (107) has an octagonal shape, the first doped region (106) has an octagonal ring shape, the first doping pattern (110) has a segmented ring shape that surrounds the first doped region (106), and the top surface (111) of the upper emitter region (105) is exposed through the segmented portion of the first doping pattern (110).

15. The MOS controlled thyristor device of claim 14, wherein the segmented portion of the first doping pattern (110) is disposed at a corner portion of the octagonal ring.

16. The MOS controlled thyristor device of claim 1, wherein, in view of planarity, the exposed top surface of the lower base layer (103) is provided in plurality, the exposed top surfaces of the lower base layer (103) are provided in plural circular shapes spaced apart from each other, the exposed top surfaces of the lower base regions (103) are arranged to be spaced apart from each other along the first direction (D1) and a second direction (D2), wherein the second direction (D2) is parallel to the first surface (100a) of the substrate (100) and crosses the first direction (D1), the top surface (112) of the upper base region (104) has a ring shape that surrounds the exposed top surface of each of the lower base regions (103), the first doping pattern (110) has a segmented ring shape that surrounds the top surface (112) of the upper base region (104), and the first doping pattern (106) is configured to surround the first doping pattern (110).

\* \* \* \* \*